(12) United States Patent
Moore et al.

(10) Patent No.: US 6,953,720 B2
(45) Date of Patent: Oct. 11, 2005

(54) METHODS FOR FORMING CHALCOGENIDE GLASS-BASED MEMORY ELEMENTS

(75) Inventors: John T. Moore, Boise, ID (US); Terry L. Gilton, Boise, ID (US); Kristy A. Campbell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/787,121

(22) Filed: Feb. 27, 2004

(65) Prior Publication Data

US 2004/0185625 A1 Sep. 23, 2004

Related U.S. Application Data

(62) Division of application No. 10/230,327, filed on Aug. 29, 2002, now Pat. No. 6,856,002.

(51) Int. Cl.[7] ........................................... H01L 21/8242
(52) U.S. Cl. ........................... 438/238; 438/29; 438/381
(58) Field of Search ...................... 438/3, 29, 238–256, 438/381–399

(56) References Cited

U.S. PATENT DOCUMENTS

| | | | |
|---|---|---|---|
| 3,271,591 | A | 9/1966 | Ovshinsky |
| 3,961,314 | A | 6/1976 | Klose et al. |
| 3,966,317 | A | 6/1976 | Wacks et al. |

(Continued)

FOREIGN PATENT DOCUMENTS

| | | |
|---|---|---|
| WO | WO 97/48032 | 12/1997 |
| WO | WO 99/28914 | 6/1999 |
| WO | WO 00/48196 | 8/2000 |
| WO | WO 02/21542 | 3/2002 |

OTHER PUBLICATIONS

Abdel–All, A; Elshafie, A; Elhawary, M.M. DC electric–field effect in bulk and thin–film Ge5As38Te57 chalcogenide glass, Vacuum 59 (2000) 845–853.
Adler, D.; Moss, S.C., Amorphous memories and bistable switches, J. Vac. Sci. Technol. 9 (1972) 1182–1189.
Adler, D.; Henisch, H.K.; Mott, S.N., The mechanism of threshold switching in amorphous alloys, Rev. Mod. Phys. 50(1978) 209–220.
Afifi, M.A.; Labib, H.H.; El–Fazary, M.M.; Fadel, M., Electrical and thermal properties of chalcogenide glass system Se75Ge25–xSbx, Appl. Phys. A 55 (1992) 167–169.
Affi,M.A.; Labib, H.H.; Fouad, S.S.; El–Shazly, A.A., Electrical & thermal conductivity of the amorphous semiconductor GexSe1–x, Egypt, J. Phys. 17 (1986) 335–342.
Alekperova, Sh.M.; Gadzhieva, G.S., Current–Voltage charactersitics of Ag2Se single crystal near the phase transition, Inorganic Materials 23 (1987) 137–139.
Aleksiejunas, A.; Cesnys, A., Switching phenomenon and memory effect in thin–film heterojunction of polycrystalline selenium–silver selenide, Phys. Stat. Sol. (a) 19 (1973) K169–K171.
Angell, C.A., Mobile ions in amorphous solids, Annu. Rev. Phys. Chem. 43 (1992) 693–717.
Anlya, M., Average electronegativity, medium–range–order, and ionic conductivity in superionic glasses, Solid state Ionics 136–137 (2000) 1085–1089.

(Continued)

*Primary Examiner*—H. Jey Tsai
(74) *Attorney, Agent, or Firm*—Dickstein Shapiro Morin & Oshinsky LLP

(57) ABSTRACT

The present invention provides a design for a PCRAM element which incorporates multiple metal-containing germanium-selenide glass layers of diverse stoichiometries. The present invention also provides a method of fabricating the disclosed PCRAM structure.

45 Claims, 22 Drawing Sheets

U.S. PATENT DOCUMENTS

| | | | |
|---|---|---|---|
| 3,983,542 A | 9/1976 | Ovshinsky | |
| 3,988,720 A | 10/1976 | Ovshinsky | |
| 4,177,474 A | 12/1979 | Ovshinsky | |
| 4,267,261 A | 5/1981 | Hallman et al. | |
| 4,597,162 A | 7/1986 | Johnson et al. | |
| 4,608,296 A | 8/1986 | Keem et al. | |
| 4,637,895 A | 1/1987 | Ovshinsky et al. | |
| 4,646,266 A | 2/1987 | Ovshinsky et al. | |
| 4,664,939 A | 5/1987 | Ovshinsky | |
| 4,668,968 A | 5/1987 | Ovshinsky et al. | |
| 4,670,763 A | 6/1987 | Ovshinsky et al. | |
| 4,673,957 A | 6/1987 | Ovshinsky et al. | |
| 4,678,679 A | 7/1987 | Ovshinsky | |
| 4,696,758 A | 9/1987 | Ovshinsky et al. | |
| 4,698,234 A | 10/1987 | Ovshinsky et al. | |
| 4,710,899 A | 12/1987 | Young et al. | |
| 4,728,406 A | 3/1988 | Banerjee et al. | |
| 4,737,379 A | 4/1988 | Hudgens et al. | |
| 4,766,471 A | 8/1988 | Ovshinsky et al. | |
| 4,769,338 A | 9/1988 | Ovshinsky et al. | |
| 4,775,425 A | 10/1988 | Guha et al. | |
| 4,788,594 A | 11/1988 | Ovshinsky et al. | |
| 4,809,044 A | 2/1989 | Pryor et al. | |
| 4,818,717 A | 4/1989 | Johnson et al. | |
| 4,843,443 A | 6/1989 | Ovshinsky et al. | |
| 4,845,533 A | 7/1989 | Pryor et al. | |
| 4,853,785 A | 8/1989 | Ovshinsky et al. | |
| 4,891,330 A | 1/1990 | Guha et al. | |
| 5,128,099 A | 7/1992 | Strand et al. | |
| 5,159,661 A | 10/1992 | Ovshinsky et al. | |
| 5,166,758 A | 11/1992 | Ovshinsky et al. | |
| 5,177,567 A | 1/1993 | Klersy et al. | |
| 5,296,716 A | 3/1994 | Ovshinsky et al. | |
| 5,335,219 A | 8/1994 | Ovshinsky et al. | |
| 5,341,328 A | 8/1994 | Ovshinsky et al. | |
| 5,359,205 A | 10/1994 | Ovshinsky | |
| 5,406,509 A | 4/1995 | Ovshinsky et al. | |
| 5,414,271 A | 5/1995 | Ovshinsky et al. | |
| 5,500,532 A | 3/1996 | Kozicki et al. | |
| 5,534,711 A | 7/1996 | Ovshinsky et al. | |
| 5,534,712 A | 7/1996 | Ovshinsky et al. | |
| 5,536,947 A | 7/1996 | Klersy et al. | |
| 5,543,737 A | 8/1996 | Ovshinsky | |
| 5,591,501 A | 1/1997 | Ovshinsky et al. | |
| 5,596,522 A | 1/1997 | Ovshinsky et al. | |
| 5,687,112 A | 11/1997 | Ovshinsky | |
| 5,694,054 A | 12/1997 | Ovshinsky et al. | |
| 5,714,768 A | 2/1998 | Ovshinsky et al. | |
| 5,751,012 A | 5/1998 | Wolstenholme et al. | |
| 5,761,115 A | 6/1998 | Kozicki et al. | |
| 5,789,277 A | 8/1998 | Zahorik et al. | |
| 5,825,046 A | 10/1998 | Czubatyj et al. | |
| 5,896,312 A | 4/1999 | Kozicki et al. | |
| 5,912,839 A | 6/1999 | Ovshinsky et al. | |
| 5,914,893 A | 6/1999 | Kozicki et al. | |
| 5,933,365 A | 8/1999 | Klersy et al. | |
| 6,011,757 A | 1/2000 | Ovshinsky | |
| 6,084,796 A | 7/2000 | Kozicki et al. | |
| 6,087,674 A | 7/2000 | Ovshinsky et al. | |
| 6,141,241 A | 10/2000 | Ovshinsky et al. | |
| RE37,259 E | 7/2001 | Ovshinsky | |
| 6,339,544 B1 | 1/2002 | Chiang et al. | |
| 6,348,365 B1 | 2/2002 | Moore et al. | |
| 6,388,324 B2 | 5/2002 | Kozicki et al. | |
| 6,404,665 B1 | 6/2002 | Lowery et al. | |
| 6,418,049 B1 | 7/2002 | Kozicki et al. | |
| 6,429,064 B1 | 8/2002 | Wicker | |
| 6,437,383 B1 | 8/2002 | Xu | |
| 6,462,984 B2 | 10/2002 | Xu et al. | |
| 6,469,364 B1 | 10/2002 | Kozicki | |
| 6,480,438 B1 | 11/2002 | Park | |
| 6,487,113 B1 | 11/2002 | Park et al. | |
| 6,501,111 B1 | 12/2002 | Lowery | |
| 6,507,061 B1 | 1/2003 | Hudgens et al. | |
| 6,511,862 B2 | 1/2003 | Hudgens et al. | |
| 6,511,867 B2 | 1/2003 | Lowery et al. | |
| 6,512,241 B1 | 1/2003 | Lai | |
| 6,514,805 B2 | 2/2003 | Xu et al. | |
| 6,531,373 B2 | 3/2003 | Gill et al. | |
| 6,534,781 B2 | 3/2003 | Dennison | |
| 6,545,287 B2 | 4/2003 | Chiang | |
| 6,545,907 B1 | 4/2003 | Lowery et al. | |
| 6,555,860 B2 | 4/2003 | Lowery et al. | |
| 6,563,164 B2 | 5/2003 | Lowery et al. | |
| 6,566,700 B2 | 5/2003 | Xu | |
| 6,567,293 B1 | 5/2003 | Lowery et al. | |
| 6,569,705 B2 | 5/2003 | Chiang et al. | |
| 6,570,784 B2 | 5/2003 | Lowery | |
| 6,576,921 B2 | 6/2003 | Lowery | |
| 6,586,761 B2 | 7/2003 | Lowery | |
| 6,589,714 B2 | 7/2003 | Maimon et al. | |
| 6,590,807 B2 | 7/2003 | Lowery | |
| 6,593,176 B2 | 7/2003 | Dennison | |
| 6,597,009 B2 | 7/2003 | Wicker | |
| 6,605,527 B2 | 8/2003 | Dennison et al. | |
| 6,613,604 B2 | 9/2003 | Maimon et al. | |
| 6,621,095 B2 | 9/2003 | Chiang et al. | |
| 6,625,054 B2 | 9/2003 | Lowery et al. | |
| 6,642,102 B2 | 11/2003 | Xu | |
| 6,646,297 B2 | 11/2003 | Dennison | |
| 6,649,928 B2 | 11/2003 | Dennison | |
| 6,667,900 B2 | 12/2003 | Lowery et al. | |
| 6,671,710 B2 | 12/2003 | Ovshinsky et al. | |
| 6,673,648 B2 | 1/2004 | Lowery | |
| 6,673,700 B2 | 1/2004 | Dennison et al. | |
| 6,674,115 B2 | 1/2004 | Hudgens et al. | |
| 6,687,153 B2 | 2/2004 | Lowery | |
| 6,687,427 B2 | 2/2004 | Ramalingam et al. | |
| 6,690,026 B2 | 2/2004 | Peterson | |
| 6,696,355 B2 | 2/2004 | Dennison | |
| 6,714,954 B2 | 3/2004 | Ovshinsky et al. | |
| 2002/0000666 A1 | 1/2002 | Kozicki et al. | |
| 2002/0168820 A1 | 11/2002 | Kozicki et al. | |
| 2002/0182835 A1 * | 12/2002 | Quinn | 438/597 |
| 2003/0048744 A1 | 3/2003 | Ovshinsky et al. | |
| 2003/0212724 A1 | 11/2003 | Ovshinsky et al. | |
| 2003/0212725 A1 | 11/2003 | Ovshinsky et al. | |
| 2004/0035401 A1 | 2/2004 | Ramachandran et al. | |

OTHER PUBLICATIONS

Asahara, Y.; Izumitani, T., Voltage controlled switching in Cu–As–Se compositions, J. Non–Cryst. Solids 11 (1972) 97–104.

Asokan, S.; Prasad, M.V.N.; Parthasarathy, G.; Gopal, E.S.R., Mechanical and chemical thresholds in IV–VI chalcogenide glasses, Phys. Rev. Lett. 62 (1989) 808–810.

Baranovski, S.D.; Cordes, H., On the conduction mechanism in Ionic glasses, J. Chem. Phys. 111 (1999) 7546–7557.

Belin, R.; Taillades, G.; Pradel, A.; Ribes, M., Ion dynamics in superionic chalcogenide glasses: complete conductivity spectra, Solid state Ionics 136–137 (2000) 1025–1029.

Belin, R.; Zerouale, A.; Pradel, A.; Ribes, M., Ion dynamics in the argyrodite compound Ag7GeSe51; non–Arrhenius behavior and complete conductivity spectra, Solid State Ionics 143 (2001) 445–455.

Benmore, C.J.; Salmon, P.S., Structure of fast ion conducting and semiconducting glassy chalcogenide alloys, Phys. Rev. Lett. 73 (1994) 264–267.

Bernede, J.C., Influence du metal des electrodes sur les caracteristiques courant–tension des structures M–Ag2e–M, Thin solid films 70 (1980) L1–L4.

Bernede, J.C., Polarized memory switching in MIS thin films, Thin Solid Films 87 (1981) 155–160.

Bernede, J.C., Switching and silver movements in Ag2Se thin films, Phys. Stat. Sol. (a) 57 (1980) K101–K404.

Bernede, J.C.; Abachi, T., Differential negative resistance in metal/insulator/metal structures with an upper bilayer electrode, Thin solid films 131 (1985) L61–L64.

Bernede, J.C.; Conan, A.; Fousenan't, E.; El Bouchairi, B.; Goureaux, G., Polarized memory switching effects in Ag2Se/Se/M thin film sandwiches, Thin solid films 97 (1982) 165–171.

Bernede, J.C.; Khelil, A.; Kattaf, M.; Conan, A., Transition from S–to N–type differential negative resistance in Al–Al2O3–Ag2–xSe1+ x thin film structures, Phys. Stat. Sol. (a) 74 (1982) 217–224.

Bondarev, V.N.; Pikhitsa, P.V., A dendrite model of current instability in RbAg4I5, Solid State Ionics 70/71 (1994) 72–76.

Boolchand, P., The maximum in glass transition temperature (Tg) near x=1/3 i nGexSe1–xGlasses, Asian Journal of Physics (2000) 9, 709–72.

Boolchand, P.; Bresser, W.J., Mobile silver ions and glass formation in solid electrolytes, Nature 410 (2001) 1070–1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georglev, D.G.; Bresser, W.J. Onset of rigidity in steps in chalcogenide glasses, Properties and Applications of Amorphous Materials, M.F. Thorpe and Tichy, L (eds.) Kluwer Academic Publishers, the Netherlands, 2001, pp. 97–132.

Boolchand, P.; Enzweller, R.N.; Tenhover, M., Structural ordering of evaporated amorphous chalcogenide alloy fims: role of thermal annealing, Diffusion and Defect Data vol. 53–54 (1987) 415–420.

Boolchand, P.; Grothaus, J.; Bresser, W.J.; Suranyl, P., Structural origin of broken chemical order in a GeSe2 glass, Phys. Rev. B 25 (1982) 2975–2978.

Boolchand, P.; Grothaus, J.; Phillips, J.C., Broken chemical order and phase separation in GexSe1–x glasses, Solid state comm. 45 (1983) 183–185.

Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 45221–0030.

Boolchand, P., Grothaus, J, Molecular Structure of Melt–Quenched GeSe2 and GeS2 glasses compared, Proc. Int. Conf. Phys. Semicond. (Eds. Chadi and Harrison) $17^{th}$ (1985) 833–36.

Bresser, W.; Boolchand, P.; Suranyi, P., Rigidity percolation and molecular clustering in network glasses, Phys. Rev. Lett. 56 (1986) 2493–2496.

Bresser, W.J.; Boolchand, P.; Suranyl, P.; de Neufville, J.P, Intrinsically broken chalcogen chemical order in stoichiometric glasses, Journal de Physique 42 (1981) C4–193–C4–196.

Bresser, W.J.; Boolchand, P.; Suranyi, P.; Hernandez, J.G., Molecular phase seperation and cluster size in GeSe2 glass, Hyperfine Interactions 27 (1986) 389–392.

Cahen, D.; Gilet, J.–M.; Schmitz, C.; Chemyak, L.; Gartsman, K.; Jakubowicz, A., Room–Temperature, electric field induced creation of stable devices in CuinSe2 Crystals, Science 258 (1992) 271–274.

Chatterjee, R.; Asokan, S.; Titus, S.S.K., Current–controlled negative–resistance behavior and memory switching in bulk As–Te–Se glasses, J. Phys. D: Appl. Phys. 27 (1994) 2624–2627.

Chen, C.H.; Tai, K.L., Whisker growth induced by Ag photodoping in glassy GexSe1–x films, Appl. Phys. Lett. 37 (1980) 1075–1077.

Chen, G.; Cheng, J.; Chen, W., Effect of Si3N4 on chemical durability of chalcogenide glass, J. Non–Cryst. Solids 220 (1997) 249–253.

Cohen, M.H.; Neale, R.G.; Paskin, A., A model for an amorphous semiconductor memory device, J. Non–Cryst. Solids 8–10 (1972) 885–891.

Croitoru, N.; Lazarescu, M.; Popescu, C.; Telnic, M.; and Vescan, L., Ohmic and non–ohmic conduction in some amorphous semiconductors, J. Non–Cryst. Solids 8–10 (1972) 781–786.

Dalven, R., Gill, R., Electrical properties of beta–Ag2Te and beta–Ag2Se from 4.2 to 300K, J. Appl. Phys. 38 (1967) 753–756.

Davis, E.A., Semiconductors without form, Search 1 (1970) 152–155.

Dearnaley, G.; Stoneham, A.M.; Morgan, D.V., Electrical phenomena in amorphous oxide, films, Rep. Prog. Phys. 33 (1970) 1129–1191.

Dejus, R.J.; Susman, S. Volin, K.J.; Montague, D.G.; Price, D.L., Structure of Vitreous Ag–Ge–Se, J. Non–Cryst. Solids 143 (1992) 162–180.

den Boer, W., Threshold switching in hydrogenated amorphous silicon, Appl. Phys. Lett. 40 (1982) 812–813.

Drusedau, T.P.; Panckow, A.N.; Klabunde, F., The hydrogenated amorphous silicon/nanodisperse metal (SIMAL) system–Films of unique electronic properties, J. Non–Cyst. Solids 198–200 (1996) 829–832.

El Bouchairi, B.; Bernede, J.C.; Burgaud, P., Properties of Ag2–xSe1+x/n–S1 diodes, Thin Solid Films 110 (1983) 107–113.

El Gharras, Z.; Bourahla, A.; Vautier, C., Role of photoinduced defects in amorphous GexSe1–x photoconductivity, J. Non–Cryst. Solids 155 (1993) 171–179.

El Ghrandi, R.; Calas, J.; Galibert, G.; Averous, M., Silver photodissolution in amorphous chalcogenide thin films, Thin Solid Films 218 (1992) 259–273.

El Ghrandi, R.; Calas, J.; Gallibert, G., Ag dissolution kinetics in amorphous GeSe5.5 thin films from "in–situ" resistance measurements vs time, Phys. Stat. Sol. (a) 123 (1991) 451–460.

El–kady, Y.L., The threshold switching in semiconducting glass Ge21Se17Te62, Indian J. Phys. 70A (1996) 507–516.

Elliott, S.R., A unified mechanism for metal photodissolution in amorphous chalcogenide materials, J. Non–Cryst. Solids 130 (1991) 85–97.

Elliott, S.R., Photodissolution of metals in chalcogenide glasses: A unified mechanism, J., Non Cryst. Solids 137–138 (1991) 1031–1034.

Elsamanoudy, M.M.; Hegab, N.A.; Fadel, M., Conduction mechanism in the pre–switching state of thin fims contain Te As Ge Si Vacuum 6 (1995) 701–707.

El–Zahed, H.; El–Korashy, A., Influence of composition on the electrical and optical properties of Ge20BixSe80–x films, Thin Solid Films 376 (2000) 236–240.

Fadel, M., Switching phenomenon in evaporated Se–Ge–As thin films of amorphous chalcogenide glass, Vacuum 44 (1993) 851–855.

Fadel, M., El–Shair, H.T., Electrical, thermal and optical properties of Se75Ge7Sb18, Vacuum 43 (1992) 253–257.

Feng, X.; Bresser, W.J.; Boolchand, P., Direct evidence for stiffness threshold in Chalcogenide glasses, Phys. Rev. Lett. 78 (1997) 4422–4425.

Feng, X.; Bresser, W.J.; Zhang, M., Goodman, B.; Boolchand, P., Role of network connectivity on the elastic, plastic and thermal behavior of covalent glasses, J. Non–Cryst. Solids 222 (1997) 134–143.

Fischer–Colbrie, A.; Blenenstock, A.; Fuoss, P.H.; Marcus, M.A., Structure and bonding in photodiffused amorphous Ag–GeSe2 thin films, Phys. Rev. B 38 (1988) 12388–12403.

Fieury, G.; Hamou, A.; Viger, C.; Vautier, C., Conductivity and crystallization of amorphous selenium, Phys. Stat. Sol. (a) 64 (1981) 311–316.

Fritzsche, H, Optical and electrical energy gaps in amorphous semiconductors, J. Non–Cryst. Solids 6 (1971) 49–71.

Fritzsche, H., Electronic phenomena in amorphous semiconductors, Annual Review of Materials Science 2 (1972) 697–744.

Gates, B.; Wu, Y.; Yin, Y. Yang, P.; Xia, Y, Single–crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013–1018.

Guin, J.–P.; Rouxel, T., Keryvin, V.; Sangleboeuf, J.–C.; Serre, I.; Lucas, J., Indentation creep of Ge–Se chalcogenide glasses below Tg: elastic recovery and non–Newtonian flow, J. Non–Cryst. Solids 298 (2002) 260–269.

Guin, J.–P.; Rouxel, T.; Sanglebouef, J.–C; Melscoet, I.; Lucas, J., Hardness, toughness, and scratchability of germanium–selenium chalcogenide glasses, J. Am. Ceram. Soc. 85 (2002) 1545–52.

Gupta, Y.P., On electrical switching and memory effects in amorphous chalcogenides, J. Non–Cryst. Sol. 3 (1970) 148–154.

Haberland, D.R.; Stiegler, H., New experiments on the charge–controlled switching effect in amorphous semiconductors, J. Non–Cryst. Solids 8–10 (1972) 408–414.

Haifz, M.M.; Ibrahim, M.M.; Dongol, M.; Hammad, F.H., Effect of composition on the structure and electrical properties of As–Se–Cu glasses, J. Apply. Phys. 54 (1983) 1950–1954.

Hajto, J.; Rose, M.J.; Osborne, I.S., Snell, A.J.; Le Combar, P.G.; Owen, A.E., Quantization effects in metal/a–SI:H/metal devices, Int. J. Electronics 73 (1992) 911–913.

Hajto, J.; Hu, J.; Snell, A.J.; Turvey, K.; Rose, M., DC and AC measurements on metal/a–SI:H/metal room temperature quantised resistance devices, J. Non–Cryst, Solids 266–269 (2000) 1058–1061.

Hajto, J.; McAuley, B.; Snell, A.J.; Owen, A.E., Theory of room temperature quantized resistance effects in metal-l–a–Si:H–metal thin film structures, J. Non–Cryst, Solids 198–200 (1996) 825–828.

Hajto, J.; Owen, A.E.; Snell, A.J.; Le Comber, P.G.; Rose, M.J., Analogue memory and ballistic electron effects in metal–amorphous silicon structures, Phil. Mag. B 63 (1991) 340–369.

Hayashi, T.; Ono, Y.; Fukaya, M.; Kan, H., Polarized memory switching in amorphous Se film, Japan. J. Appl. Phys. 13 (1974) 1163–1164.

Hegab, N.A.; Fadel, M., Sedeek, K., Memory switching phenomena in thin films of chalcogenide semiconductors, Vacuum 45 (1994) 459–462.

Hirose, Y.; Hirose, H., Polarity–dependent memory switching and behavior of Ag dendrite in Ag–photodoped amorphous As2S3 films, J. Appl. Phys. 47 (1976) 2767–2772.

Hong, K.S.; Speyer, R.F., Switching behavior in II–IV–V2 amorphous semiconductor systems, J. Non–Cryst. Solids 116 (1990) 191–200.

Hosokawa, S., Atomic and electronic structures of glassy GexSe1–x around the stiffness threshold composition, J. Optoelectronics and Advanced Materials 3 (2001) 199–214.

Hu, J.; Snell, A.J.; Hajto, J.; Owen, A.E., Constant current forming in Cr/p+a–/SI:H/V thin film devices, J. Non–Cryst. Solids 227–230 (1998) 1187–1191.

Hu, J.; Hajto, J.; Snell, A.J.; Owen, A.E.; Rose, M.J., Capacitance anomaly near the metal–non–metal transition in Cr–hydrogenated amorphous Si–V thin–film devices, Phil. Mag. B. 74 (1996) 37–50.

Hu, J.; Snell, A.J.; Hajto, J.; Owen, A.E., Current–Induced Instability in Cr–p+a–Si:H–V thin film devices, Phil. Mag. B 80 (2000) 29–43.

Iizima, S.; Sugi, M.; Kikuchi, M.; Tanaka, K., Electrical and thermal properties of semiconducting glasses As–Te–Ge, Solid State Comm. 8 (1970) 153–155.

Ishikawa, R.; Kikuchi, M., Photovoltaic study on the photo–enhanced diffusion of Ag in amorphous films of Ge2S3, J. Non–Cryst. Solids 35 & 36 (1980) 1061–1066.

Iyetomi, H.; Vashishta, P., Kalia, R.K., Incipient phase separation in Ag/Ge/Se glasses: clustering of Ag atoms, J. Non–Cryst. Solids 262 (2000) 135–142.

Jones, G.; Collins, R.A., Switching properties of thin selenium films under pulsed bias, Thin Solid Films 40 (1977) L15–L18.

Joullie, A.M.; Marucchi, J., On the DC electrical conduction of amorphous As2Se7 before switching, Phys. Stat. Sol. (a) 13 (1972) K105–K109.

Joullie, A.M.; Marucchi, J., Electrical properties of the amorphous alloy As2Se5, Mat. Res. Bull. 8 (1973) 433–442.

Kaplan, T.; Adler, D., Electrothermal switching in amorphous semiconductors, J. Non–Cryst. Solids 8–10 (1972) 538–543.

Kawaguchi, T.; Maruno. S., Elliott, S.R., Optical, electrical, and structural properties of amorphous Ag–Ge–S and Ag–Ge–Se films and comparison of photoinduced and thermally induced phenomena of both systems, J. Appl. Phys. 79 (1996) 9096–9104.

Kawaguchi, T.; Masui, K., Analysis of change in optical transmission spectra resultiing from Ag photodoping in chalcogenide film, Japn. J. Appl. Phys. 26 (1987) 15–21.

Kawasaki, M.; Kawamura, J.; Nakamura, Y.; Aniya, M., Ionic conductivity of Agx(GeSe31)1–x(0<=x<=0.571) glasses, Solid state Ionics 123 (1999) 259–269.

Kluge, G.; Thomas, A.; Klabes, R.; Grotzschel, R., Silver photodiffusion in amorphous GexSe100–x, J. Non–Cryst. Solids 124 (1990) 186–193.

Kolobov, A.V., On the origin of p–type conductivity in amorphous chalcogenides, J. Non–Cryst. Solids 198–200 (1996) 728–731.

Kolobov, A.V., Lateral diffusion of silver in vitreous chalcogenide films, J. Non–Cryst. Solids 137–138 (1991) 1027–1030.

Korkinova, Ts. N.; Andreichin, R.E., Chalcogenide glass polarization and the type of contacts, J. Non–Cryst. Solids 194 (1996) 256–259.

Kotkata, M.F.; Afif, M.A.; Labib, H.H.; Hegab, N.A.; Abdel–Aziz, M.M., Memory switching in amorphous GeSeTi chalcogenide semiconductor films, Thin Solid Films 240 (1994) 143–146.

Lakshminarayan, K.N.; Srivastava, K.K.; Penwar, O.S.; Dumar, A., Amorphous semiconductor devices: memory and switching mechanism, J. Instn Electronics & Telecom. Engrs 27 (1981) 16–19.

Lal, M., Goyal, N., Chemical bond approach to study the memory and threshold switching chalcogenide glasses, Indian Journal of pure & appl. phys. 29 (1991) 303–304.

Leimer, F.; Stotzel, H.; Kottwitz, A., Isothermal electrical polarisation of amorphous GeSe films with blocking Al contacts influenced by Poole–Frankel conduction, Phys. Stat. Sol. (a)29 (1975) K129–K132.

Leung, W.; Cheung, N.; Neureuther, A.R., Photoinduced diffusion of Ag in $GexSe1-x$ glass, Appl. Phys. Lett 46 (1985) 543–545.

Matsushita, T.; Yamagami, T.; Okuda, M., Polarized memory effect observed on Se–SnO2 system, Jap. J. Appl. Phys. 11 (1972) 1657–1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L., Reversible and irreversible electrical switching in TeO2–V205 based glasses, Journal de Physique IV 2 (1992) C2–185–C2–188.

Messoussi, R.; Bernede, J.C.; Benhida, S.; Abachi, T.; Latef, A., Electrical characterization of M/Se structures (M=NI, BI), Mat. Chem, And Phys. 28 (1991) 253–258.

Mitkova, M.; Boolchand, P., Microscopic origin of the glass forming tendency in chalcogenides and constraint theory, J. Non–Cryst. Solids 240 (1998) 1–21.

Mitkova, M.; Kozicki, M.N., Silver Incorporation in Ge–Se glasses used in programmable metallization cell devices, J. Non–Cryst. Solids 299–302 (2002) 1023–1027.

Mitkova, M.; Wang, Y.; Boolchand, P., Dual chemical role of Ag as an additive in chalcogenide glasses, Phys. Rev. Lett. 83 (1999) 3848–3851.

Miyatani, S.–y., Electronic and ionic conduction in $(AgxCu1-x)2Se$, J. Phys. Soc. Japan 34 (1973) 423–432.

Miyatani, S.–y., Electrical properties of Ag2Se, J. Phys. Soc. Japan 13 (1958) 317.

Miyatani, S.–y., Ionic conduction in beta–Ag2Te and beta–Ag2Se, Journal Phys. Soc. Japan 14 (1959) 996–1002.

Mott, N.F., Conduction in glasses containing transition metal ions, J. Non–Cryst. Solids 1 (1968) 1–17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564–569.

Nakayama, K.; Kojima, K; Hayakawa, F.; Imai, Y.; Kawagawa, A.; Suzuki, M., Submicron nonvolatile memory cell based on reversible phase transition in chalcogenide glasses, Jpn. J. Appl. Phys. 39 (2000) 6157–6161.

Nang, T.T.; Okuda, M.; Matsushita, T.; Yokota, S.; Suzuki, A., Electrical and optical parameters of $GexSe1-x$ amorphous thin films, Jap. J. App. Phys. 15 (1976) 849–853.

Narayanan, R.A.; Asokan, S.; Kumar, A., Evidence concerning the effect of topology on electrical switching in chalcogenide network glasses, Phys. Rev. B 54 (1996) 4413–4415.

Neale, R.G.; Aseltine, J.A., The application of amorphous materials to computer memories, IEEE transactions on electron dev. Ed–20 (1973) 195–209.

Ovshinsky S.R.; Fritzsche, H., Reversible structural transformations in amorphous semiconductors for memory and logic, Mettalurgical transactions 2 (1971) 641–645.

Ovshinsky, S.R., Reversible electrical switching phenomena in disordered structures, Phys. Rev. Lett. 21 (1968) 1450–1453.

Owen, A.E.; LeComber, P.G.; Sarrabayrouse, G.; Spear, W.E., New amorphous–silicon electrically programmable nonvolatile switching device, IEE Proc. 129 (1982) 51–54.

Owen, A.E.; Firth, A.P.; Ewen, P.J.S., Photo–induced structural and physico–chemical changes in amorphous chalcogenide semiconductors, Phil. Mag. B 52 (1985) 347–362.

Owen, A.E.; Le Comber, P.G.; Hajto, J.; Rose, M.J.; Snell, A.J., Switching in amorphous devices, Int. J. Electronics 73 (1992) 897–906.

Pearson, A.D.; Miller, C.E., Filamentary conduction in semiconducting glass diodes, App. Phys. Lett. 14 (1969) 280–282.

Pinto, R.; Ramanathan, K.V., Electric field induced memory switching in thin films of the chalcogenide system Ge–As–Se, Appl. Phys. Lett. 19 (1971) 221–223.

Popescu, C., The effect of local non–uniformities on thermal switching and high field behavior of structures with chalcogenide glasses, Solid–state electronics 18 (1975) 671–681.

Popescu, C.; Croitoru, N., The contribution of the lateral thermal instability to the switching phenomenon, J. Non–Cryst. Solids 8–10 (1972) 531–537.

Popov, A.I.; Geller, I.KH.; Shemetova, V.K., Memory and threshold switching effects in amorphous selenium, Phys. Stat. Sol. (a) 44 (1977)K71–K73.

Prakash, S.; Asokan, S.; Ghare, D.B., Easily reversible memory switching in Ge–As–Te glasses, J. Phys. D: Appl. Phys. 29 (1996) 2004–2008.

Rahman, S.; Sivarama Sastry, G., Electronic switching in Ge–Bi–Se–Te glasses, Mat. Sci. and Eng. B12 (1992) 219–222.

Ramesh, K.; Asokan, S.; Sangunni, K.S.; Gopal, E.S.R., Electrical Switching in germanium telluride glasses doped with Cu and Ag, Appl. Phys. A 69 (1999) 421–425.

Rose, M.J.; Hajto, J.; Lecomber, P.G.; Gage, S.M.; Choi, W.K.; Snell, A.J.; Owen, A.E., Amorphous silicon analogue memory devices, J. Non–Cryst. Solids 115 (1989) 168–170.

Rose, M.J.; Snell, A.J.; Lecomber, P.G.; Hajto, J.; Fitzgerald, A.G.; Owen, A.E., Aspects of non–volatility in a –SI:H memory devices, Mat. Res. Soc. Symp. Proc. V 258, 1992, 1075–1080.

Schuocker, D.; Rieder, G., On the reliability of amorphous chalcogenide switching devices, J. Non–Cryst. Solids 29 (1978) 397–407.

Sharma, A.K.; Singh, B., Electrical conductivity measurements of evaporated selenium films in vacuum, Proc. Indian Natn. Sci. Acad. 46, A, (1980) 362–368.

Sharma, P., Structural, electrical and optical properties of silver selenide films, Ind. J. Of pure and applied phys. 35 (1997) 424–427.

Snell, A.J.; Lecomber, P.G.; Hajto, J.; Rose, M.J.; Owen, A.E., Osborne, I.L., Analogue memory effects in metal/a–Si:H/metal memory devices, J. Non–Cryst. Solids 137–138 (1991) 1257–1262.

Snell, A.J.; Hajto, J.; Rosa, M.J.; Osborne, L.S.; Holmes, A.; Owen, A.E.; Gibson, R.A.G., Analogue memory effects in metal/a–Si:H/metal thin films structures, Mat. Res. Soc. Symp. Proc. V 297, 1993, 1017–1021.

Steventon, A.G., Microfilaments in amorphous chalcogenide memory devices, J. Phys. D: Appl. Phys. 8 (1975) L120–L122.

Steventon, A.G., The switching mechanisms in amorphous chalcogenide memory devices, J. Non–Cryst. Solids 21 (1976) 319–329.

Stocker, H. J., Bulk and thin film switching and memory effects in semiconducting chalcogenide glasses, App. Phys. Lett. 15 (1969) 55–57.

Tanaka, K., Ionic and mixed conductions in Ag photodoping process, Mod. Phys. Lett B 4 (1990) 1373–1377.

Tanaka, K.; Iizuma, S.; Sugi, M.; Okada, Y.; Kikuchi, M., Thermal effects on switching phenomenon in chalcogenide amorphous semiconductors, Solid State Comm. 8 (1970) 387–389.

Thornburg, D.D., Memory switching in a Type 1 amorphous chalcogenide, J. Elect. Mat. 2 (1973) 3–15.

Thornburg, D.D.; White, R.M., Electric field enhanced phase separation and memory switching in amorphous arsenic triselenide, Journal (??) (1972) 4609–4612.

Tichy, L.; Ticha, H., Remark on the glass–forming ability in GexSe1–x and AsxSe1–x systems, J. Non–Cryst. Solids 261 (2000) 277–281.

Titus, S.S.K.; Chatterjee, R.; Asokan, S., Electrical switching and short–range order in As–Te glasses, Phys. Rev. B 48 (1993) 14650–14652.

Tranchant, S.;Peytavin,S.;Ribes,M.;Flank,A.M.;Dexpert,H.; Lagarde, J.P., Silver chalcogenide glasses Ag–Ge–Se: Ionic conduction and exafs structural Investigation, Transport–structure relations in fast ion and mixed conductors Proceedings of the 6th Riso International symposium, Sep. 9–13, 1985.

Tregouet, Y.; Bernede, J.C., Silver movements in Ag2Te thin films: switching and memory effects, Thin Solid Films 57 (1979) 49–54.

Uemura, O.; Kameda, Y.; Kokai, S.; Satow, T., Thermally induced crystallization of amorphous Ge0.4Se0.6, J. Non–Cryst. Solids 117–118 (1990) 219–221.

Uttecht, R.; Stevenson, H.; Sie, C.H.; Griener, J.D.; Raghaven, K.S., Electric field induced filament formation in As–Te–Ge glass, J. Non–Cryst. Solids 2 (1970) 358–370.

Viger, C.; Lefrancois, G.; Fleury, G., Anomalous behaviour of amorphous selenium films, J. Non–Cryst. Solids 33 (1976) 267–272.

Vodenicharov, C.; Parvanov,S.; Petkov,P., Electrode–limited currents in the thin–film M–GeSe–M system, Mat. Chem. And Phys. 21 (1989) 447–454.

Wang, S.–J.; Misium, G.R.; Camp, J.C.; Chen. K.–L.; Tigelaar, H.L., High–performance Metal/silicide antifuse, IEEE electron dev. Lett. 13 (1992)471–472.

Weirauch, D.F., Threshold switching and thermal filaments in amorphous semiconductors, App. Phys. Lett. 16 (1970) 72–73.

West, W.C.; Sieradzki, K.; Kardynal, B.; Kozicki, M.N., Equivalent circuit modeling of the Ag|As0.24S0.36Ag0.40|Ag System prepared by photodissolution of Ag, J. Electrochem. Soc. 145 (1998) 2971–2974.

West, W.C., Electrically erasable non–volatile memory via electrochemical deposition of multifractal aggregates, Ph. D. Dissertation, ASU 1998.

Zhang, M.; Mancini, S.; Bresser, W.; Boolchand, P., Variation of glass transition temperature, Tg, with average coordination number, <m>, in network glasses: evidence of a threshold behavior in the slope |dTg/d<m>| at the rigidity percolation threshold (<m>=2.4), J. Non–Cryst. Solids 151 (1992) 149–154.

* cited by examiner

METHODS FOR FORMING CHALCOGENIDE GLASS-BASED MEMORY ELEMENTS

This application is a divisional of application Ser. No. 10/230,327, filed on Aug. 29, 2002 now U.S. Pat. No. 6,856,002, which is hereby incorporated by reference.

BACKGROUND OF THE INVENTION

1. Field of the Invention

The invention relates to the field of random access memory (RAM) devices formed using chalcogenide glass layers, and in particular to an improved programmable conductor random access memory (PCRAM) element design utilizing germanium-selenide glass layers.

2. Description of the Related Art

Programmable conductor memory elements recently have been investigated for suitability as semi-volatile and non-volatile random access memory devices. One known PCRAM element composition utilizes a germanium-selenide chalcogenide glass of $Ge_xSe_{100-x}$ stoichiometry. A metal, such as silver, is incorporated into the germanium-selenide glass. It is believed that the metal provides conductivity to the element thus allowing the element to be switched between two resistance states. Particularly, a silver-containing $Ge_xSe_{100-x}$ glass layer is positioned between two electrodes utilized in a PCRAM element.

The resistance of the silver-containing germanium-selenide glass layer can be changed between high resistance and low resistance states. The programmable conductor memory element is normally in a high resistance state when at rest. A write operation to a low resistance state is performed by applying a voltage potential across the two electrodes. When set in a low resistance state, the state of the memory element will remain intact for days or weeks after the voltage potentials are removed. The memory element can be returned to its high resistance state by applying a reverse voltage potential between the electrodes as used to write the element to the low resistance state. Again, the highly resistant state is maintained once the voltage potential is removed. This way, such a device can function, for example, as a resistance variable memory element having two resistance states, which can represent two logic states.

The stoichiometry of a $Ge_xSe_{100-x}$ glass inherently provides many different glass compositions depending on the value of x. Certain structural characteristics of $Ge_xSe_{100-x}$ have been observed with a change in the value of x. Specifically, referring now to prior art FIG. 1 (adapted from Boolchand, P., et al. "Onset of Rigidity in Steps in Chalcogenide Glasses—The Intermediate Phase" in M. Thorpe (ed.) *Properties and Applications of Amorphous Materials*, NATO Science Series (Plenum/Kluwer, 2001)), $Ge_xSe_{100-x}$ glasses that are selenium-rich, i.e., glasses having a stoichiometry whereby x is less than or equal to 20, have a loose or open glass matrix as a result of the higher proportion of Se—Se bonds which occur when the relative number of germanium atoms is low. By contrast, $Ge_xSe_{100-x}$ glass with values of x greater than 26 have a tight or rigid glass matrix due to the greater proportion of Ge—Se bonds present in the glass. $Ge_xSe_{100-x}$ glass with values of x between 20 and 26 has an intermediate glass matrix. Rigidity is relative and based on the stoichiometry of the $Ge_xSe_{100-x}$ glass. Accordingly, a $Ge_{40}Se_{60}$ glass is more rigid than a $Ge_{33}Se_{67}$ glass, and $Ge_{25}Se_{75}$ glass is more rigid than $Ge_{20}Se_{80}$ glass. Glass matrix structure is also relative and a function of the value of x. Therefore, a $Ge_{40}Se_{60}$ glass has a tighter glass matrix structure than a $Ge_{33}Se_{67}$ glass, and $Ge_{25}Se_{75}$ glass has a tighter glass matrix structure than $Ge_{20}Se_{80}$ glass.

The structure of the glass matrix, i.e., tight versus open, affects the switching characteristics of the memory element. If the $Ge_xSe_{100-x}$ glass has a tight matrix, then a larger resistance change is inhibited when a memory element switches from an on to an off state. On the other hand, if the germanium-selenide glass matrix is looser, or more open, then a larger resistance change is more easily facilitated. Accordingly, since glasses having a tight matrix inhibit a large resistance change, a PCRAM element utilizing a glass with a tight matrix will keep the programmed state longer than a PCRAM element utilizing a glass with an open matrix.

While a PCRAM element comprised exclusively of a glass with an open matrix will be placed in a low resistance state or a high resistance state more quickly than a PCRAM element comprised exclusively of a glass with a tight matrix, glass with an open matrix used by itself is also not ideal. First, a PCRAM element utilizing glass with an open matrix may allow multiple low resistive pathways to be formed during programming. The tighter glass matrix will allow formation of a preferred conductive pathway with the properties of improved switching reliability and reduced resistance drift because there are fewer resistively decaying conductive pathways. Furthermore, the low melting point of selenium-rich glass, i.e., glass with an open matrix makes fabrication of PCRAM elements containing only glass with an open matrix difficult and complicated.

What is needed is a design for a PCRAM element which provides faster operation and better data retention than that which can be obtained with either open-matrix or tight-matrix glass.

SUMMARY

The present invention provides a new structure for a PCRAM element which utilizes $Ge_xSe_{100-x}$ glass layers of varying stoichiometry. The present invention additionally provides a method for making a PCRAM element comprising $Ge_xSe_{100-x}$ glass layers of varying stoichiometry. In the preferred embodiment, the PCRAM element structure comprises a first electrode positioned beneath a first germanium-selenide glass layer with a stoichiometry providing a certain glass matrix structure. Located above this first germanium-selenide glass layer is a second germanium-selenide glass layer with a different stoichiometry providing a different glass matrix structure than the stoichiometry of the first germanium-selenide glass layer provides. A metal is introduced into each of these germanium-selenide glass layers. A second electrode is disposed on top of the second germanium-selenide glass layer.

The preferred embodiment of the method of fabricating the present invention includes: forming an insulating layer over a first electrode; forming an opening in the insulating layer to expose a portion of the first electrode; forming a first germanium-selenide glass layer of a specific stoichiometry in the opening; introducing a metal into the first germanium-selenide glass layer; forming a second germanium-selenide glass layer of a stoichiometry different from that of the first germanium-selenide glass layer, and hence a different glass structure; introducing a metal into the second germanium-selenide glass layer; and forming a second electrode over the insulating layer and over the second metal-containing germanium-selenide glass layer.

Additional advantages and features of the present invention will be apparent from the following detailed description

DETAILED DESCRIPTION

In the following description, reference is made to the accompanying drawings which will serve to illustrate exemplary embodiments of the invention. The description provides sufficient detail to enable those skilled in the art to practice the invention. Of course other embodiments may be used and various changes may be made without departing from the scope of the present invention. The scope of this invention is defined by the appended claims.

The term "substrate" used in the following description may include any supporting structure including, but not limited to, a plastic or a semiconductor substrate that has an exposed substrate surface. Semiconductor substrates should be understood to include silicon, silicon-on-insulator (SOI), silicon-on-sapphire (SOS), doped and undoped semiconductors, epitaxial layers of silicon supported by a base semiconductor foundation, and other semiconductor structures. When reference is made to a semiconductor substrate or wafer in the following description, previous process steps may have been utilized to form regions or junctions in or over the base semiconductor or foundation.

The term "silver" is intended to include not only elemental silver, but silver with other trace metals or in various alloyed combinations with other metals as known in the semiconductor industry, as long as such silver alloy is conductive, and as long as the physical and electrical properties of the silver remain unchanged.

The term "silver-selenide" is intended to include various species of silver-selenide, including some species which have a slight excess or deficit of silver, for instance, $Ag_2Se$, $Ag_{2+x}Se$, and $Ag_{2-x}Se$.

The term "semi-volatile memory device" is intended to include any memory device which is capable of maintaining its memory state after power is removed from the device for a prolonged period of time. Thus, semi-volatile memory devices are capable of retaining stored data after the power source is disconnected or removed. The term "semi-volatile memory device" as used herein includes not only semi-volatile memory devices, but also non-volatile memory devices.

Figure 3:
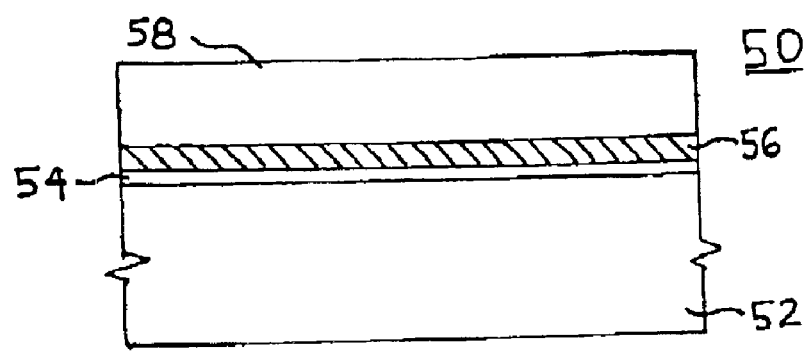
FIG. 3 is a cross-sectional view of a semiconductor substrate having a first insulating layer, a bottom electrode and second insulating layer.

FIG. 3 shows a memory element 50 at a stage of the fabrication process known in the art. A first insulating layer 54 has been formed on a substrate 52, which can be made of a material such as a silicon substrate or a variety of other materials such as plastic. Insulating layer 54 may be formed by any known deposition method, such as sputtering by chemical vapor deposition (CVD), plasma enhanced CVD (PECVS), or physical vapor deposition (PVD). First insulating layer 54 may be formed of a conventional insulating oxide, such as silicon oxide ($SiO_2$), silicon nitride ($Si_3N_4$), or any other low dielectric constant material. FIG. 3 further provides a bottom electrode 56 formed over first insulating layer 54. The bottom electrode 56 preferably comprises tungsten, but may comprise any conductive material.

Figure 4:
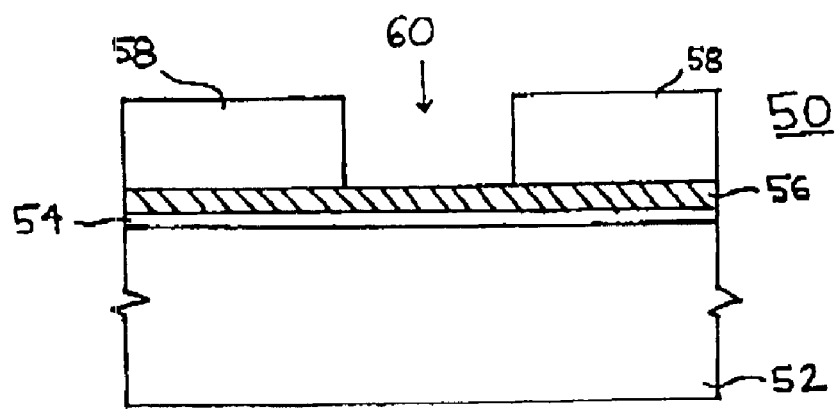
FIG. 4 shows the substrate of FIG. 3 undergoing the process of the preferred embodiment of the present invention.

Using the FIG. 3 structure containing bottom electrode 56 as a starting point and referring to the processing sequence shown in FIG. 2, a first embodiment of the invention will now be explained. At step 300 in FIG. 2, a second insulating layer 58 is formed over bottom electrode 56, as shown in FIG. 3. The second insulating layer 58 may comprise the same materials as first insulating layer 54, such as $SiO_2$ and $Si_3N_4$. At step 310 an opening 60 is formed in second insulating layer 58 to provide the structure shown in FIG. 4. Opening 60 may be formed by known methods in the art, such as a conventional patterning and etching process. Opening 60 is formed such that the surface of bottom electrode 56 is exposed in opening 60. After the patterning and etch back process any masking material used is stripped away to leave the structure at a state represented in FIG. 4.

At step 320 a first chalcogenide glass, preferably a germanium-selenide glass layer 62, is formed in opening 60 on top of bottom electrode 58. The first germanium-selenide glass layer 62 is preferably germanium-selenide of $Ge_xSe_{100-x}$ stoichiometry. More preferably germanium-selenide glass layer 62 has formula $Ge_xSe_{100-x}$ where x is between about 18 and about 33 or about 38 and about 43

Figure 5:
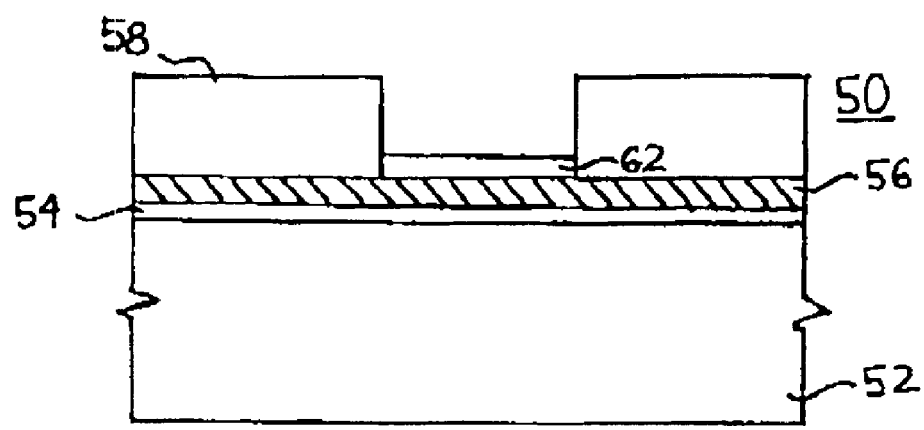
FIG. 5 shows the substrate of FIG. 4 at a processing step subsequent to that shown in FIG. 4.

The formation of the first germanium-selenide glass layer 62 having the preferred stoichiometric formula may be accomplished by any appropriate method. Evaporation, co-sputtering germanium and selenium in appropriate ratios, sputtering using a germanium-selenide target having the desired stoichiometry, or chemical vapor deposition with stoichiometric amounts of $GeH_4$ and $SeH_2$ gases (or various compositions of these gases), which result in a germanium-selenide layer of the desired stoichiometry are methods which may be used to form germanium-selenide glass layer 62. First germanium-selenide glass layer 62 is then planarized and etched back by techniques known in the art to provide a structure such as a that shown in FIG. 5.

Referring back to FIG. 2, a metal, preferably silver, is incorporated into the first germanium-selenide glass layer 62 at step 330. Preferably, about 1% to about 10% less than the maximum amount of silver necessary to keep first germanium-selenide glass layer 62 in an amorphous state is ultimately incorporated into the glass layer, totaling less than or equal to about 33% of the glass layer. The method by which the metal is incorporated into the first germanium-selenide glass layer 62 depends on the stoichiometry of the germanium-selenide glass. For example, when a germanium-selenide glass layer having a stoichiometry of $Ge_xSe_{100-x}$, the value of x determines the method by which metal is incorporated into the germanium-selenide glass layer. For germanium-selenide glass of formula $Ge_xSe_{100-x}$, where x is less than or equal to 33, for example, metal may be introduced into first germanium-selenide glass layer 62 by treatment with light irradiation.

Figure 6:
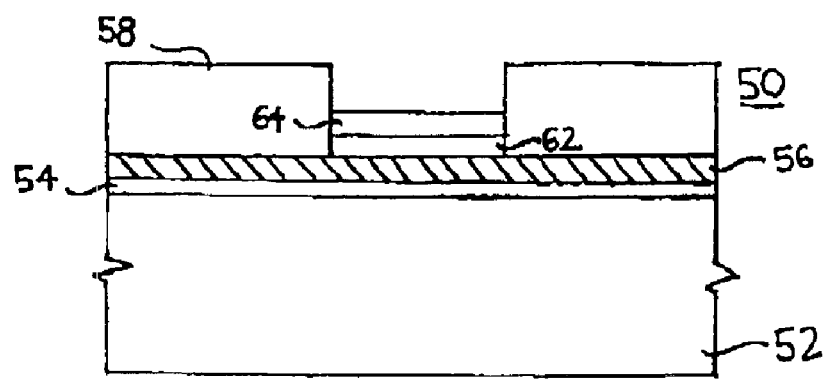
FIG. 6 shows the substrate of FIG. 5 at a processing step subsequent to that shown in FIG. 5.

Specifically, referring now to FIG. 6, a metal-containing layer 64 (preferably containing silver (Ag) or silver-selenide) is deposited over first germanium-selenide glass layer 62. For purposes of simplified discussion, metal and metal-containing layer 64 will be further described herein as silver and a silver-containing layer.

Figure 7:
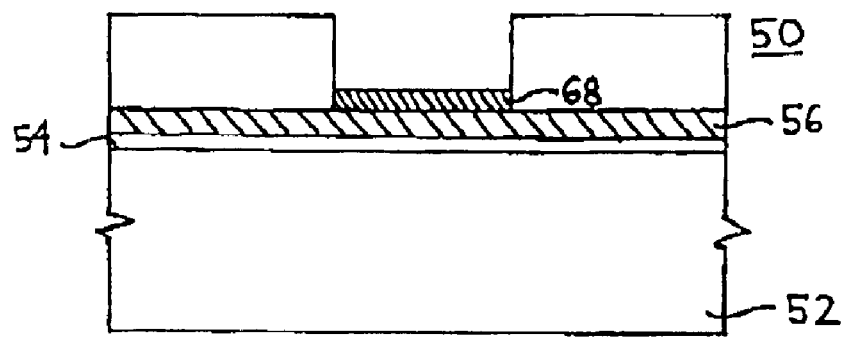
FIG. 7 shows the substrate of FIG. 6 at a processing step subsequent to that shown in FIG. 6.

The method of incorporating silver into germanium-selenide glass layer 62 varies according to the silver-containing layer 64 utilized. Where silver-containing layer 64 is silver, for example, incorporation of silver into the first germanium-selenide glass layer 62 may be accomplished by irradiating the layers with light. The layers are irradiated for about 5 to 30 minutes at between about 1 $mW/cm^2$ to about 10 $mW/cm^2$ with electromagnetic radiation from a wavelength of about 200 nm to about 600 nm. The irradiation process breaks Ge—Se and Se—Se bonds in the first germanium-selenide glass layer 62, allowing Se from germanium-selenide layer 62 to combine with Ag provided in silver-containing layer 64 and forming silver-selenide first germanium-selenide glass layer 62. In addition, irradiation may be used in combination with a thermal process using a temperature of about 50° C. to about 350° C., and preferably about 110° C. for about 5 to about 15 minutes, and more preferably about 10 minutes. This heating drives silver from silver-containing layer 64 into first germanium-selenide glass layer 62, which may provide an additional source of Ag to bond with Se after the light treatment. Removing excess silver-containing layer 64 from device 50 leaves a first silver-containing germanium-selenide glass layer 68, as shown in FIG. 7. Other embodiments of the present invention may retain silver-containing layer 64.

Referring back to FIG. 6, if silver-containing layer 64 is silver-selenide, first silver-containing germanium-selenide layer 68 may alternatively be obtained by virtue of adjacent placement of germanium-selenide glass layer 62 and silver-containing layer 64 without the irradiation step described above.

Figure 6A:
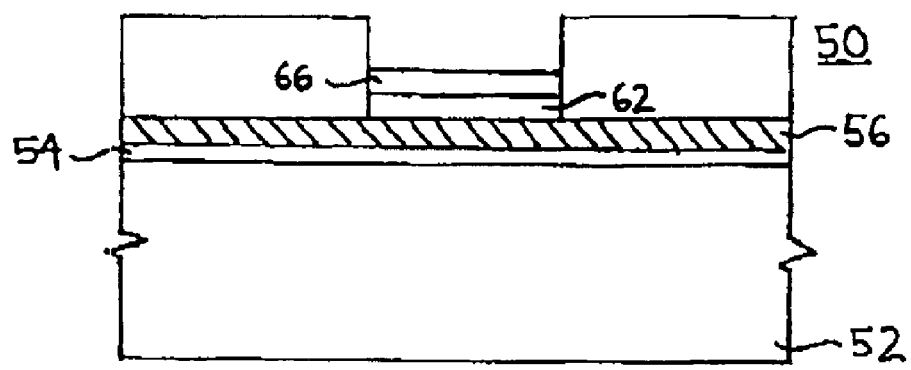
FIG. 6A shows the substrate of FIG. 5 at an alternative processing step subsequent to that shown in FIG. 5.
Figure 7A:
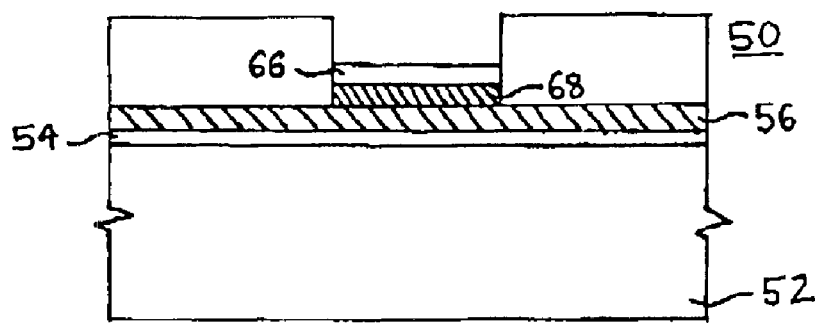
FIG. 7A shows the substrate of FIG. 6A at a processing step subsequent to that shown in FIG. 6A.

For embodiments of the present invention utilizing a first germanium-selenide glass layer 62 with $Ge_xSe_{100-x}$ stoichiometry and x between about 38 and about 43, silver may be introduced to the germanium-selenide glass layer by utilizing a silver-selenide layer as described above. Specifically, referring now to FIG. 6A, a metal-chalcogenide layer 66 is deposited on first germanium-selenide glass layer 62. Preferably the metal chalcogenide includes silver-selenide. For the purposes of simplified discussion, the metal chalcogenide layer 66 will be further described herein as a silver-selenide layer. Silver-selenide layer 66 may be deposited by any suitable method known in the art, with dry plasma deposition (DPD) preferred. Silver-selenide migrates into first germanium-selenide glass layer 62. Referring to FIG. 7A, this migration of silver into the germanium-selenide glass changes the composition of the first germanium-selenide glass layer to that of a first silver-containing germanium-selenide glass layer 68. Silver-selenide layer 66 may then be removed by any method known in the art.

Figure 8:
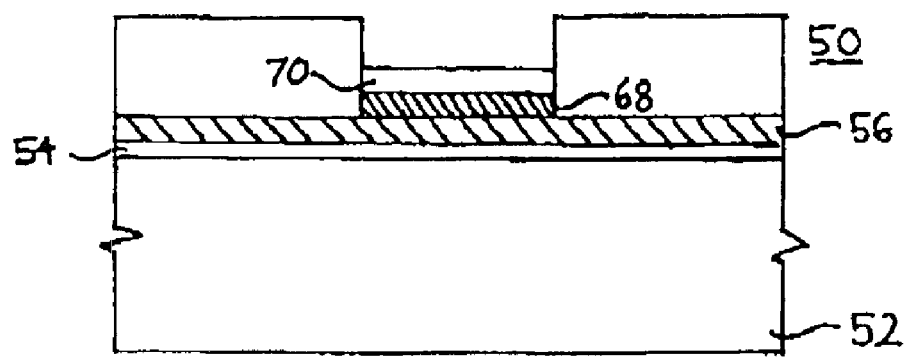
FIG. 8 shows the substrate of FIG. 7 at a processing step subsequent to that shown in FIG. 7.

Regardless of which method is employed to incorporate silver into first germanium-selenide glass layer 62 to form a first silver-containing germanium-selenide glass layer 68, a second silver-containing germanium-selenide glass layer is subsequently formed in the present invention. Referring to FIG. 2, at step 340 a second chalcogenide glass, preferably a second germanium-selenide glass layer 70, is deposited in opening 60, as shown in FIG. 8. This may be accomplished in the same ways that first germanium-selenide glass layer 62 is deposited at step 320. This second germanium-selenide glass layer 70 preferably has a stoichiometry of $Ge_xSe_{100-x}$. The second germanium-selenide glass layer 70 preferably has more of an open glass matrix than the first germanium-selenide glass layer 62, i.e., the second germanium-selenide glass layer preferably contains a smaller proportion of germanium as demonstrated by a smaller value of x.

One preferred embodiment includes a first germanium-selenide glass layer 62 having a value of x of about 38 to about 43 (preferably with a value of x of about 40), and a second germanium-selenide glass layer 70 having a value of x of about 18 to about 33 with a value of about 25 preferable. This particular embodiment utilizes a first glass with a tight matrix and a second glass with an open matrix as defined by the value of x. It must be understood, however, that both glass can have open matrices and both can have tight matrices. In addition, a first germanium-selenide glass layer 62 may be utilized that has a more open matrix than second germanium-selenide glass layer 70. The present invention requires only that there be a diversity in the value of x between the first and second germanium-selenide glass layers 62, 70. As with first germanium-selenide glass layer 62, the stoichiometry of second germanium-selenide glass layer 70 and its relative stoichiometry and glass matrix structure with respect to first germanium-selenide glass layer 62 is wholly dependent on the desired electrical character of the PCRAM element.

Figure 1:
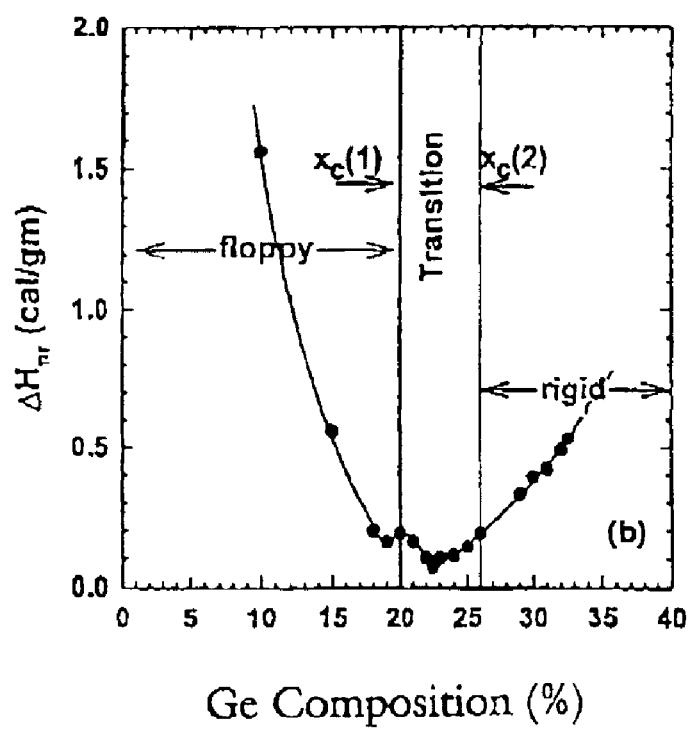
FIG. 1 shows the values of x in the formula $Ge_xSe_{100-x}$ which provide for an open matrix ("floppy") and a tight matrix ("rigid")
Figure 2:
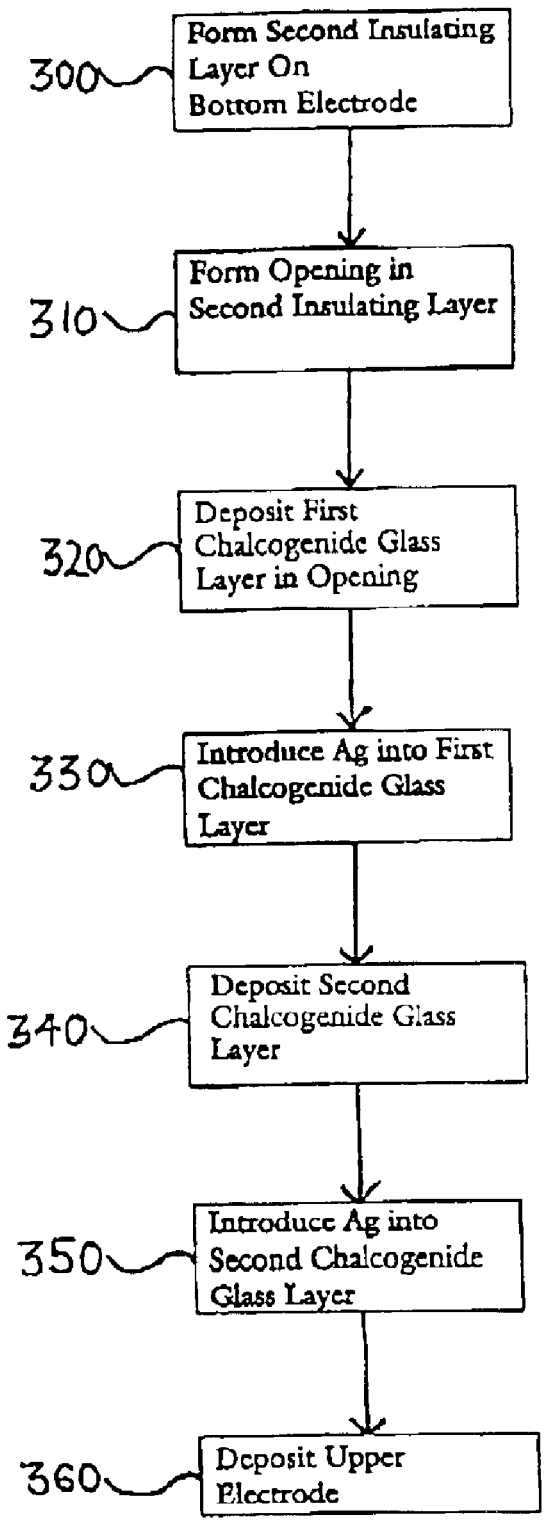
FIG. 2 is a flowchart showing the steps of fabricating a memory element in accordance with the preferred embodiment of the present invention.
Figure 9:
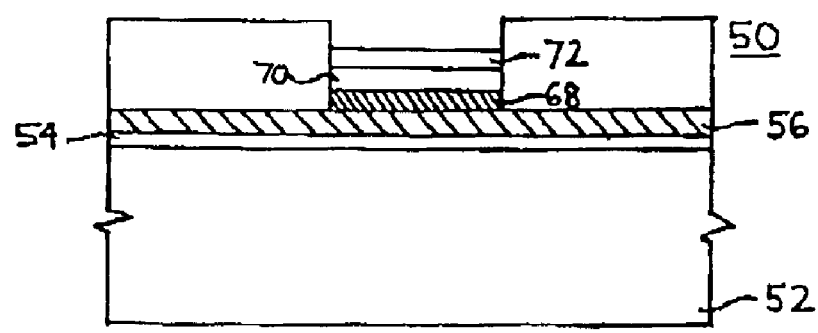
FIG. 9 shows the substrate of FIG. 8 at a processing step subsequent to that shown in FIG. 8.
Figure 10:
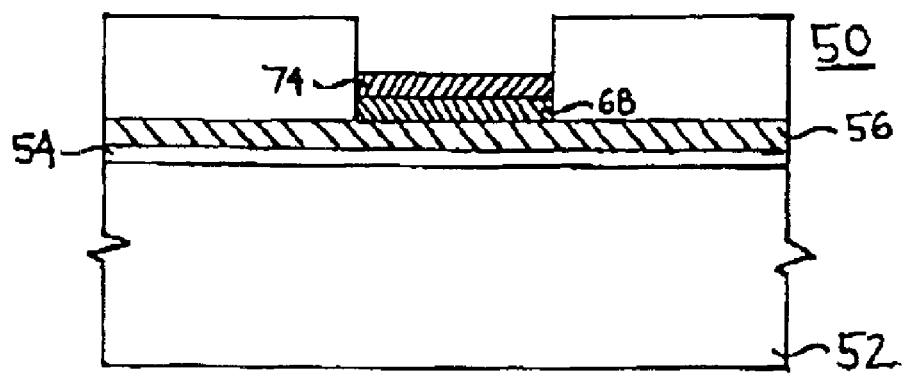
FIG. 10 shows the substrate of FIG. 9 at a processing step subsequent to that shown in FIG. 9.

At step 350 of FIG. 2 silver is introduced into the second germanium-selenide glass layer 70. This may be carried out in accordance with the description of step 330 where silver is introduced into the first germanium-selenide glass layer 62. Referring to FIG. 8 and FIG. 9, where a second silver-containing layer 72 is silver, for example, incorporation of silver into the second germanium-selenide glass layer 70 may be accomplished by irradiating the layers with light, as described above. The thermal process described above may also be used with the irradiation process. Removing excess silver-containing layer 72 from device 50 leaves a second silver-containing germanium-selenide glass layer 74, as shown in FIG. 10. Other embodiments of the present invention may retain silver-containing layer 72.

Referring back to FIG. 9, if second silver-containing layer 72 is silver-selenide, second silver-containing germanium-selenide layer 74 may alternatively be obtained by virtue of adjacent placement of germanium-selenide glass layer 62 and silver-containing layer 64 without the irradiation step described above. Where x has a value between about 38 and 43, a silver-containing layer (preferably comprising silver-selenide) is deposited over second germanium-selenide glass layer 70, and silver is allowed to migrate from the silver-containing layer to the second germanium-selenide glass layer 70, as in step 330.

Figure 11:
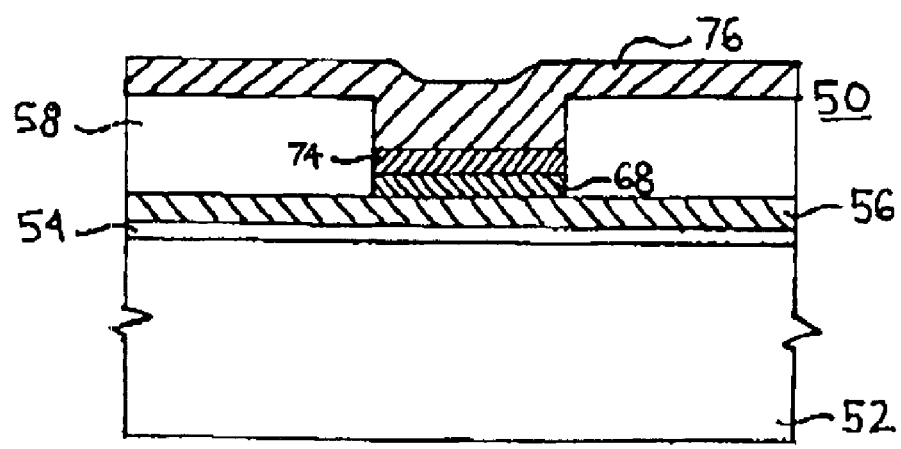
FIG. 11 shows the substrate of FIG. 10 at a processing step subsequent to that shown in FIG. 10.

Either method of incorporating silver into the germanium-selenide glass layer results in a second silver-containing germanium-selenide glass layer 74, as shown in FIG. 10 (where silver-containing layer 72 has been stripped). At step 360, an upper electrode is deposited over the previous layer to form a semiconductor device 50 as shown in FIG. 11. The upper electrode is preferably silver, but may comprise any suitable conductive material.

Figure 11A:
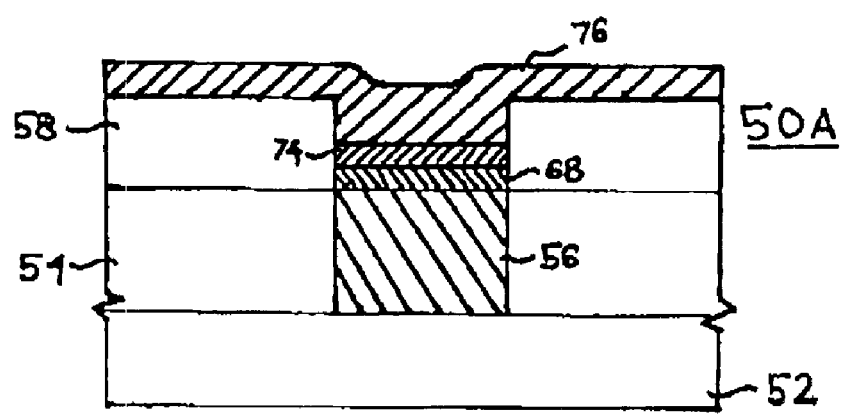
FIG. 11A shows an alternative embodiment of the substrate shown in FIG. 11.

It should be recognized that the present invention may be utilized in any of a number of memory cell configurations known in the art. For example, the memory cell 50A shown in FIG. 11A is provided where bottom electrode 56 is deposited in an opening formed in first insulating layer 54, rather than on top of first insulating layer 54, as shown in FIG. 11. The specific memory cell configuration will vary according to the specific application of the desired memory cell by altering, among other factors, the deposition and etching processes employed.

Figure 12:
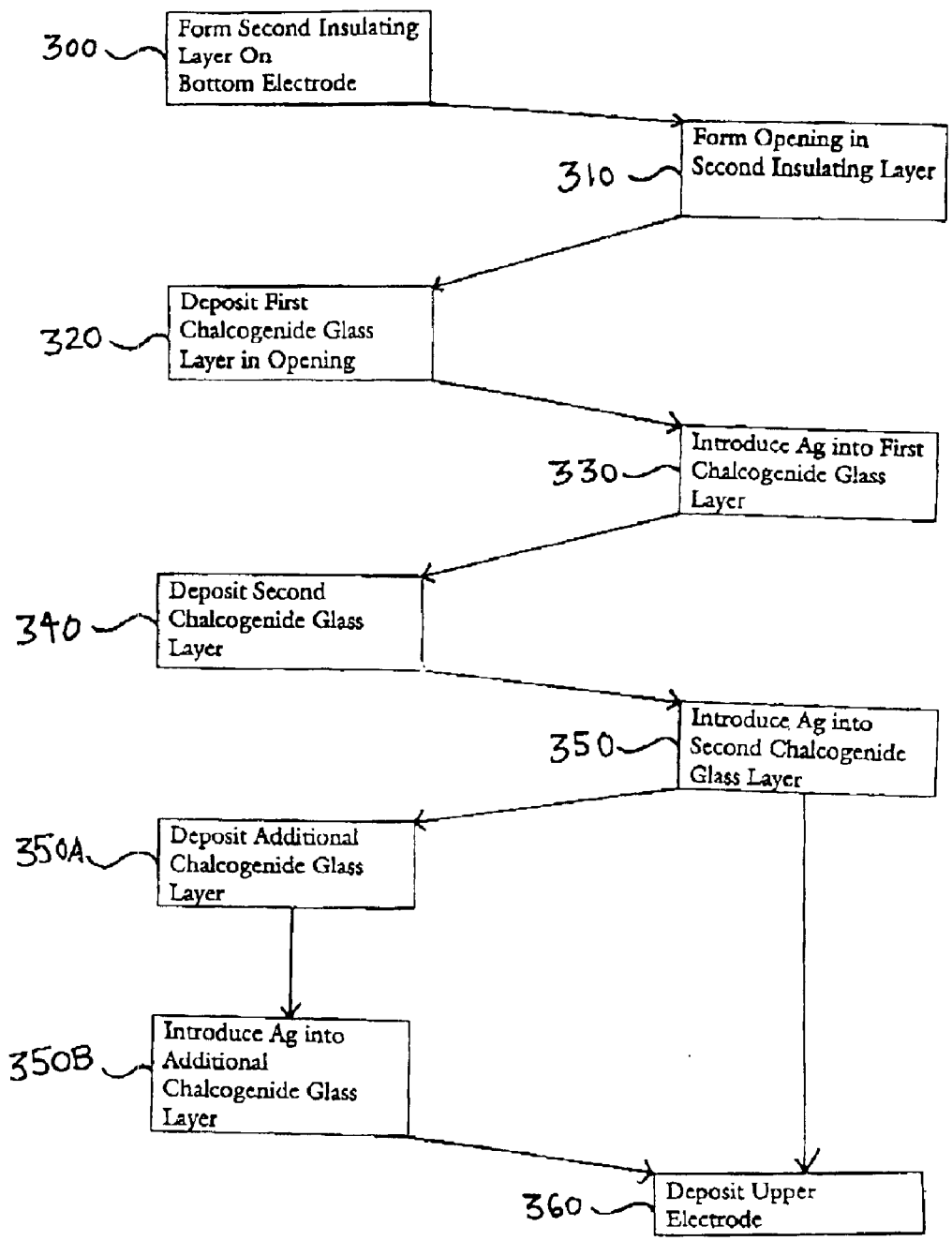
FIG. 12 is a flowchart showing the steps of fabricating a memory element in accordance with a second preferred embodiment of the present invention.
Figure 13:
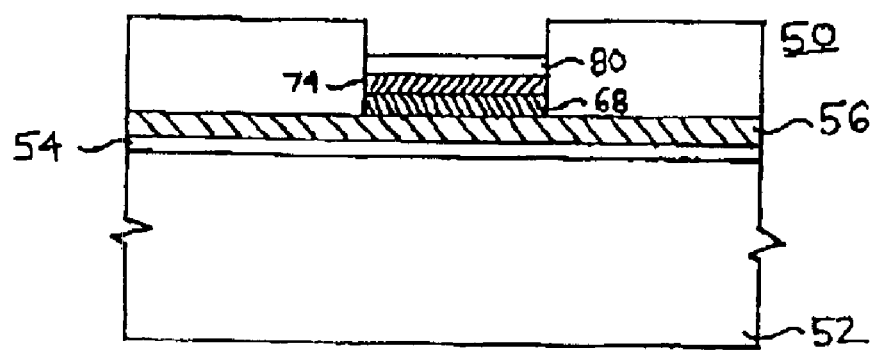
FIG. 13 shows the substrate of FIG. 10 undergoing the process of the second preferred embodiment of the present invention.

Referring now to FIG. 12, a second embodiment of the present invention includes forming at least one additional silver-containing germanium-selenide glass layer above second silver-containing germanium-selenide glass layer 74. This is accomplished in the same way that second silver-containing germanium-selenide glass layer 74 is formed over first silver-containing germanium-selenide glass layer 68. Specifically, at step 350A, a chalcogenide glass, preferably an additional germanium-selenide glass layer 80, is deposited in opening 60 as shown in FIG. 13. This may be accomplished in the same ways that second germanium-selenide glass layer 70 is deposited at step 340. The additional germanium-selenide glass layer 80 preferably has a stoichiometry of $Ge_xSe_{100-x}$. The additional germanium-selenide glass layer 80 has a glass matrix structure distinct from any adjacently placed germanium-selenide glass layer, including second silver-containing germanium-selenide glass layer 74 in the case of a first additional silver-containing germanium-selenide glass layer. The additional germanium-selenide glass layer 80 may have the same glass matrix structure as any germanium-selenide glass layer not adjacent to additional germanium-selenide glass layer 80, such as first silver-containing germanium-selenide glass layer 68.

Figure 15:
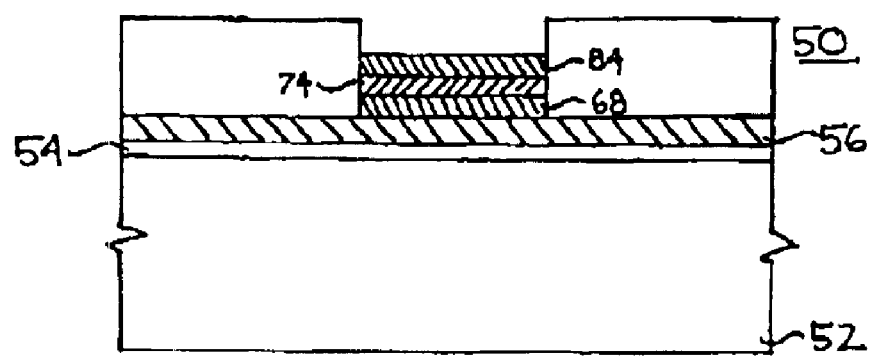
FIG. 15 shows the substrate of FIG. 14 at a processing step subsequent to that shown in FIG. 14.

At step 350B of FIG. 12, silver is introduced into the additional germanium-selenide glass layer 80. This may be carried Out in accordance with the description of step 330 where silver is introduced into the first germanium-selenide glass layer 62. Referring to FIG. 8 and FIG. 9, where an additional silver-containing layer 82 is silver, for example, incorporation of silver into the additional germanium-selenide glass layer 80 may be accomplished by irradiating the layers with light, as described above. The thermal process described above may also be used with the irradiation process. Removing excess silver-containing layer 82 from device 50 leaves an additional silver-containing germanium-selenide glass layer 84, as shown in FIG. 15. Other embodiments of the present invention may retain silver-containing layer 82.

Figure 14:
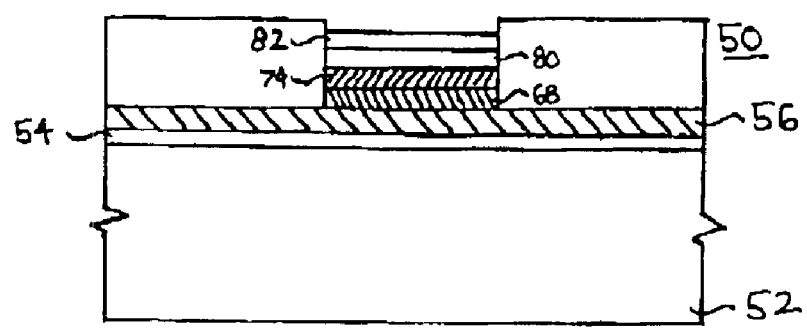
FIG. 14 shows the substrate of FIG. 13 at a processing step subsequent to that shown in FIG. 13.

Referring back to FIG. 14, if additional silver-containing layer 82 is silver-selenide, additional silver-containing germanium-selenide layer 84 may alternatively be obtained by virtue of adjacent placement of additional germanium-selenide glass layer 80 and additional silver-containing layer 82 without the irradiation step described above. Where x has a value between about 38 and 43, a silver-containing layer (preferably comprising silver-selenide) is deposited over additional germanium-selenide glass layer 80, and silver is allowed to migrate from the silver-containing layer to the additional germanium-selenide glass layer 80, as in step 330. Either method of incorporating silver into the germanium-selenide glass layer results in an additional silver-containing germanium-selenide glass layer 84, as shown in FIG. 15 (where silver-containing layer 82 has been stripped).

Figure 16:
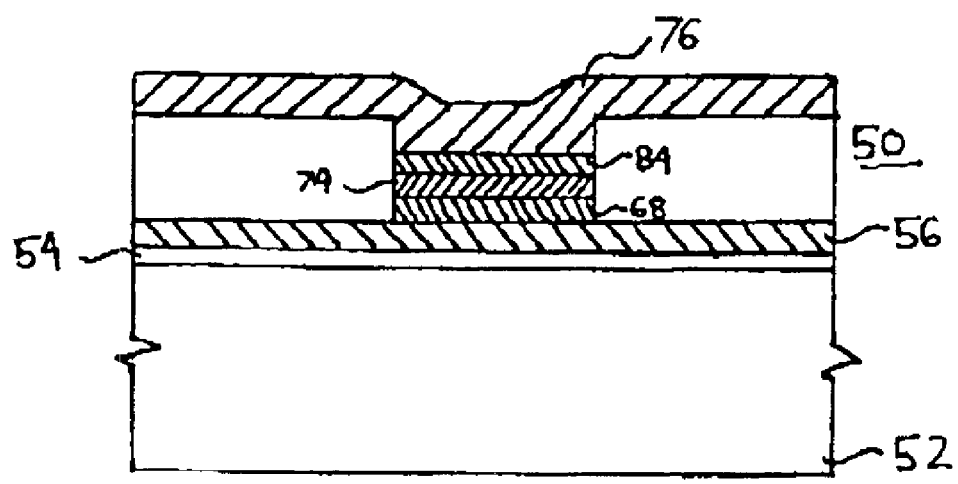
FIG. 16 shows the substrate of FIG. 15 at a processing step subsequent to that shown in FIG. 15.

At step 360, an upper electrode 76 is deposited over the previous layer (in this case 84) to form a semiconductor device 50 as shown in FIG. 16. The upper electrode is preferably silver, but may comprise any suitable conductive material.

Referring to FIG. 16, one preferred embodiment of the memory element comprising at least one additional germanium-selenide layer includes a first silver-containing germanium-selenide glass layer 68 having a value of x of about 38 to about 43 (preferably with a value of x of about 40), and a second silver-containing germanium-selenide glass layer 74 having a value of x of about 18 to about 33 with a value of about 25 preferable. The at least one additional silver-containing germanium-selenide layer 84 has a value of x different from the value of x for the second silver-containing germanium-selenide glass layer 74, and preferably from about 38 to about 43, more preferably 40, the same value as x for the first silver-containing germanium-selenide glass layer 68.

In the resulting memory element, first silver-containing germanium-selenide glass layer 68 and additional silver-containing germanium-selenide glass layer 84 have equal stoichiometries providing a tight glass matrix structure, while second silver-containing germanium-selenide glass layer 74 has a stoichiometry providing an open glass matrix structure. However, as discussed above with reference to the first embodiment of the present invention, and FIG. 5 and FIG. 8, first and second germanium-selenide glass layers 62, 70 (and consequently first and second silver-containing germanium-selenide layers 68, 74) need only have diverse values of x, without a requirement that the first germanium-selenide glass layer 62 have a higher value of x or a tighter glass matrix structure than second germanium-selenide glass layer 70. The present invention likewise does not require that additional germanium-selenide glass layer 80 (and consequently additional silver-containing germanium-selenide glass layer 84) have any particular value of x or glass matrix structure. Additional silver-containing germanium-selenide glass layer 84 must only have a value of x and a glass matrix structure different from adjacent silver-containing germanium-selenide glass layers, such as the second silver-containing germanium-selenide glass layer 74.

Figure 16A:
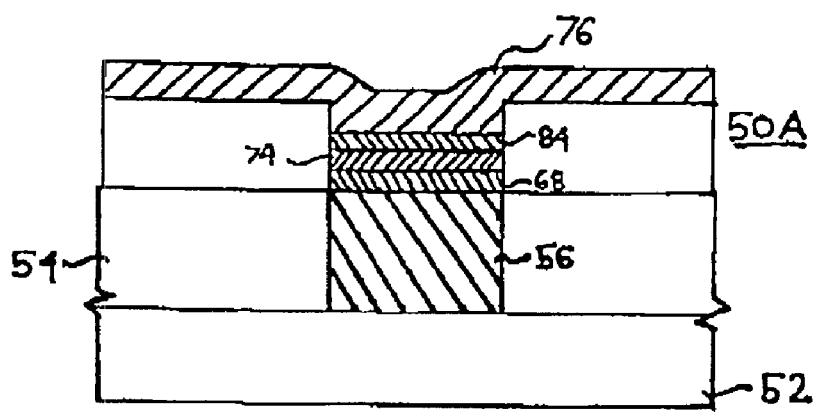
FIG. 16A shows an alternative embodiment of the substrate shown in FIG. 16.

As with FIG. 11A, the memory cell 50A shown in FIG. 16A is provided where bottom electrode 56 is deposited in an opening formed in first insulating layer 54, rather than on top of first insulating layer 54, as shown in FIG. 16. The specific memory cell configuration will vary according to the specific application of the desired memory cell by altering, among other factors, the deposition and etching processes employed.

Referring to FIG. 16, this allows for many embodiments provided by the present invention. For example, in addition to the previously disclosed embodiment where first and additional silver-containing germanium-selenide glass layers 68, 84 had equal values of x providing tighter glass matrix structures and second silver-containing germanium-selenide glass layer 74 had a more open glass structure, first and additional silver-containing germanium-selenide glass layers 68, 84 may have equal values of x providing more open glass matrix structure compared to second silver-containing germanium-selenide glass layer 74 having a more tight glass matrix structure. Furthermore, first silver-containing germanium-selenide glass layer 68 may have a more tight glass matrix structure than second silver-containing germanium-selenide glass layer 74, which in turn may have a more tight glass matrix structure than additional silver-containing germanium-selenide glass layer 84, providing a stack of silver-containing germanium-selenide glass layers with descendingly graded stoichiometries. These values of x can be inverted to provide a stack of silver-containing germanium-selenide glass layers with ascendingly graded stoichiometries.

Figure 17:
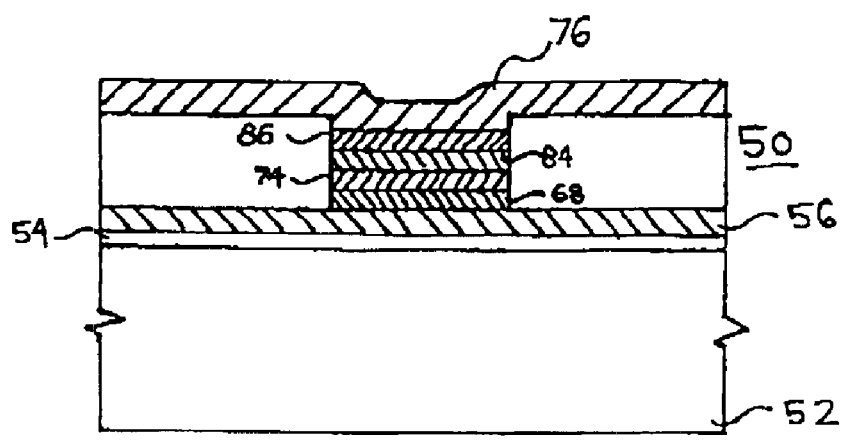
FIG. 17 shows an additional memory element according to second preferred embodiment of the present invention.
Figure 17A:
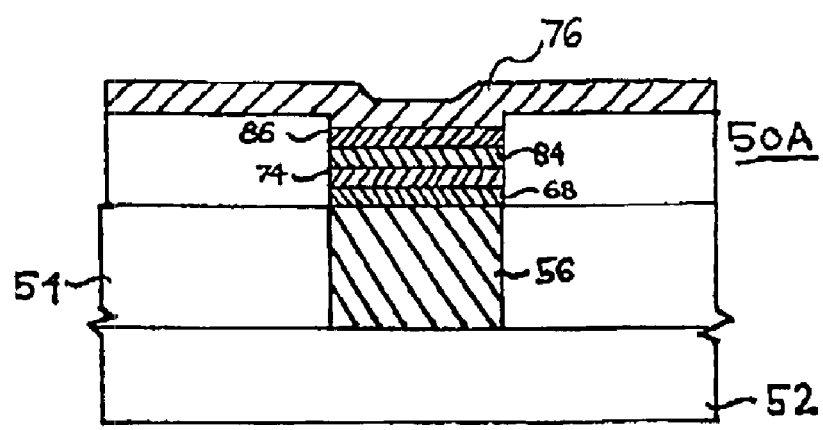
FIG. 17A shows and alternative embodiment of the substrate shown in FIG. 17.

It should be readily apparent to a person of ordinary skill in the art that the present invention provides many combinations of silver-containing germanium-selenide stacks for use in memory fabrication. Referring now to FIG. 17, it is clear that a memory element fabricated according to the present invention also is not limited in the number of silver-containing germanium-selenide layers included. FIG. 17 provides four distinct silver-containing germanium-selenide glass layers 68, 74, 84, and 86. Stoichiometries which may be used are those included in the above description of forming memory elements comprising at least one additional silver-containing germanium-selenide glass layer. As with FIG. 11A and FIG. 16A above, memory cell 50A shown in FIG. 17A is provided where bottom electrode 56 is deposited in an opening formed in first insulating layer 54, rather than on top of first insulating layer 54, as shown in FIG. 17. The specific memory cell configuration will vary according to the specific application of the desired memory cell by altering, among other factors, the deposition and etching processes employed.

The combination of silver-containing germanium-selenide glass layers 68, 74 (and 84, 86 in embodiments comprising at least one additional silver-containing germanium-selenide glass layer) may be selected according to the desired electronic characteristics of the memory element being fabricated. Additionally, utilizing a relatively open-matrix germanium-selenide glass layers with tighter-matrix rigid glass layers provides increased adhesion between the glass and the semiconductor side walls. This is because a more open-matrix glass has greater ability to deform to surface defects and therefore provides greater surface area for contact. The increased presence of free selenium in open-matrix glass may also form bonds with side wall constituents such as silicon, thus aiding in adhesion.

PCRAM performance with respect to both electrical characteristics and side wall adhesion will vary depending on the germanium-selenide glass composition, the order of silver-containing germanium-selenide glass layers, and the number of silver-containing germanium-selenide glass layers. It should therefore be readily understood that the invention can be modified in these specific respects as well as to any number of variations, alterations, substitutions or equivalent arrangements not heretofore described, but which are commensurate with the spirit and scope of the invention in order to obtain a desired memory functionality. Accordingly, the invention is not to be seen as limited by the foregoing description, but is only limited by the scope of the appended claims.

What is claimed as new and desired to be protected by Letters Patent of the United States is:

1. A method of fabricating a memory element comprising the acts of:
   forming a first chalcogenide glass layer, said first chalcogenide glass layer having a first stoichiometry;
   introducing a metal into said first chalcogenide glass layer to form a first metal-containing chalcogenide glass layer;
   forming a second chalcogenide glass layer, said second chalcogenide glass layer having a second stoichiometry different from said first stoichiometry; and
   introducing a metal into said second chalcogenide glass layer to form a second metal-containing chalcogenide glass layer.

2. A method of claim 1 wherein said first chalcogenide glass layer comprises a first germanium-selenide glass layer and said second chalcogenide glass layer comprises a second germanium-selenide glass layer.

3. A method of claim 2 wherein said first and said second germanium-selenide glass layers have a stoichiometric composition of about $Ge_xSe_{100-x}$.

4. A method of claim 3 wherein the value of x for said first germanium-selenide glass layer is greater than the value of x for said second germanium-selenide glass layer.

5. A method of claim 4 wherein the value of x for said first germanium-selenide glass layer is about 38 to about 43 and the value of x for said second germanium-selenide glass layer is about 18 to about 33.

6. A method of claim 5 wherein the value of x for said first germanium-selenide glass layer is about 40 and the value of x for said second germanium-selenide glass layer is about 25.

7. A method of claim 3 wherein the value of x for said first germanium-selenide glass layer is less than the value of x for said second germanium-selenide glass layer.

8. A method of claim 3 wherein silver is introduced into said first and said second germanium-selenide glass layers.

9. A method of claim 8 wherein the step of introducing silver into any of the said first or said second germanium-selenide glass layers having a value of x between about 18 and about 33 comprises the steps of:
   depositing a silver-containing layer over said any of the said first or said second germanium-selenide glass layers having a value of x between about 18 and about 33;
   irradiating said any of the said first or said second germanium-selenide glass layers having a value of x between 18 and about 33 with electromagnetic radiation of wavelength of about 200 nm to about 600 nm for approximately 5 to about 30 minutes at from about 1 $mW/cm^2$ to about 10 $mW/cm^2$.

10. A method of claim 9 further comprising removing residual silver-containing layer from over irradiated said any of the said first or said second germanium-selenide glass layers having a value of x between 18 and about 33.

11. A method of claim 9 further comprising thermally heating said silver containing layer and said first or said second germanium-selenide glass layer at a temperature of about 50° C. to about 350° C. for about 5 to about 15 minutes.

12. A method of claim 11 comprising the step of thermally heating said silver containing layer and said first or said second germanium-selenide glass layer at a temperature of about 110° C.

13. A method of claim 9 wherein said silver-containing layer comprises silver-selenide.

14. A method of claim 8 wherein the step of introducing silver into any of said first of said second germanium-selenide glass layers having a value of x between about 38 and about 43 comprises the steps of:
   depositing a silver-containing layer over said any of said first or said second germanium-selenide glass layers having a value of x between about 38 and about 43;
   allowing silver from said silver-containing layer to migrate into said any of said first or said second germanium-selenide glass layers having a value of x of about 38 to about 43.

15. A method of claim 14 further comprising the step of removing residual silver-containing layer from over said first or said second germanium-selenide glass layer.

16. A method of claim 14 wherein said silver-containing layer comprises silver-selenide.

17. A method of claim 1 further comprising the act of forming a first electrode coupled to said first metal-containing chalcogenide glass layer.

18. The method of claim 17 wherein said first electrode comprises tungsten.

19. The method of claim 1 further comprising the act of forming a second electrode coupled to said second metal-containing chalcogenide glass layer.

20. The method of claim 19 wherein said second electrode comprises silver.

21. A method of fabricating a memory element comprising the steps of:
   forming a first chalcogenide glass layer, said first chalcogenide glass layer having a first glass matrix structure;
   introducing metal into said first chalcogenide glass layer to form a first metal-containing chalcogenide glass layer;
   forming a second chalcogenide glass layer, said second chalcogenide glass layer having a second glass matrix structure diverse from said first glass matrix structure;
   introducing metal into said second chalcogenide glass layer to form a second metal-containing chalcogenide glass layer;
   forming at least one additional chalcogenide glass layer, said at least one additional chalcogenide glass layer having a glass matrix structure different from the glass matrix structure of any metal-containing chalcogenide glass layer adjacent to said at least one additional metal-containing chalcogenide glass layer; and
   introducing metal into said at least one additional chalcogenide glass layer to form at least one additional metal-containing chalcogenide glass layer.

22. A method of claim 21 wherein said first chalcogenide glass layer comprises a first germanium-selenide glass layer, said second chalcogenide glass layer comprises a second germanium-selenide glass layer, and said at least one additional chalcogenide glass layer comprises at least one additional germanium-selenide glass layer.

23. A method of claim 22 wherein said first, said second, and said at least one additional germanium-selenide glass layers have a stoichiometric composition of about $Ge_xSe_{100-x}$.

24. A method according to claim 23 wherein the value of x for said at least one additional germanium-selenide glass layer equals the value of x of any other germanium-selenide glass layer, wherein said any other germanium-selenide glass layer is not positioned consecutively to said at least one additional germanium-selenide glass layer.

25. A method of claim 24 wherein said at least one additional germanium-selenide glass layer comprises a third germanium-selenide glass layer.

26. A method of claim 25 wherein the value of x for said first and said third germanium-selenide glass layers is equal.

27. A method of claim 26 wherein the value of x for said first and said third germanium-selenide glass layers is greater than the value of x for said second germanium-selenide glass layer.

28. A method of claim 27 wherein the value of x for said first and said third germanium-selenide glass layers is from about 38 to about 43 and the value of x for said second germanium-selenide glass layer is from about 18 to about 33.

29. A method of claim 28 wherein the value of x for said first and said third germanium-selenide glass layers is about 40 and the value of x for said second germanium-selenide glass layer is about 25.

30. A method of claim 23 wherein the value of x for said at least one additional germanium-selenide glass layer is diverse from the value of x for other silver-containing germanium-selenide glass layers.

31. A method of claim 30 wherein the values of x for each of said first, said second, and said at least one additional germanium-selenide glass layer ascend from said first electrode to said second electrode.

32. A method of claim 30 wherein the values of x for each of said first, said second, and said at least one additional germanium-selenide glass layer descend from said first electrode to said second electrode.

33. A method of claim 23 wherein said metal comprises silver.

34. A method of claim 33 wherein the step of introducing silver into any of the said first, said second, or said at least one additional germanium-selenide glass layers having a value of x between about 18 and about 33 comprises the steps of:
   depositing a silver-containing layer over said any of the said first, said second, or said at least one additional germanium-selenide glass layers having a value of x between about 18 and about 33;
   irradiating said any of the said first, said second, or said at least one additional germanium-selenide glass layers having a value of x between about 18 and about 33 with electromagnetic radiation of wavelength of about 200 nm to about 600 nm for approximately 5 to about 30 minutes at from about 1 mW/cm$^2$ to about 10 mW/cm$^2$.

35. A method of claim 34 further comprising removing residual silver-containing layer from over irradiated said any of the said first, said second, or said at least one additional germanium-selenide glass layers having a value of x between about 18 and about 33.

36. A method of claim 34 further comprising thermally heating said silver containing layer and said any of the said first, said second, or said at least one additional germanium-selenide glass layers having a value of x between about 18 and about 33 at a temperature of about 50° C. to about 350° C. for about 5 to about 15 minutes.

37. A method of claim 36 comprising the step of thermally heating said silver containing layer and said any of said first, said second, or said at least one additional germanium-selenide glass layer having a value of x between about 18 and about 33 at a temperature of about 110° C.

38. A method of claim 34 wherein said silver-containing layer comprises silver-selenide.

39. A method of claim 33 wherein the step of introducing silver into any of the said first, said second, or said at least one additional germanium-selenide glass layers having a value of x between about 38 and about 43 comprises the steps of:
- depositing a silver-containing layer over said any of the said first, said second, or said at least one additional germanium-selenide glass layer having a value of x between about 38 and about 43;
- allowing silver from said silver-containing layer to migrate into said any of said first, said second, or said at least one additional germanium-selenide glass layer having a value of x between about 38 and about 43.

40. A method of claim 39 further comprising the step of removing residual silver-containing layer from over said any of said first, said second, or said at least one additional germanium-selenide glass layer having a value of x between about 38 and about 43.

41. A method of claim 39 wherein said silver-containing layer comprises silver-selenide.

42. A method of claim 21 further comprising the step of forming a first electrode coupled to said first metal-containing chalcogenide glass layer.

43. A method of claim 42 wherein said first electrode comprises tungsten.

44. A method of claim 21 further comprising the step of forming a second electrode coupled to the last formed said at least one additional metal-containing chalcogenide glass layer.

45. A method of claim 44 wherein said second electrode comprises silver.

* * * * *

UNITED STATES PATENT AND TRADEMARK OFFICE
CERTIFICATE OF CORRECTION

| | |
|---|---|
| PATENT NO. | : 6,953,720 B2 |
| DATED | : October 11, 2005 |
| INVENTOR(S) | : John T. Moore et al. |

It is certified that error appears in the above-identified patent and that said Letters Patent is hereby corrected as shown below:

<u>Title page,</u>
Item [56], References Cited, U.S. PATENT DOCUMENTS, add the following:
-- 6,707,712   3/2004   Lowery --.
OTHER PUBLICATIONS, add the following:
-- Chen, G.; Cheng, J., Role of nitrogen in the crystallization of silicon nitride-doped chalcogenide glasses, J. Am. Ceram. Soc. 82 (1999) 2934-2936.
Thornburg, D.D., Memory switching in amorphous arsenic triselenide, J. Non-Cryst. Solids 11 (1972) 113-120. --.

"Bernede, J.C. Polarized memory switching in MIS thin films, Thin Solid Films 87 (1981) 155-160." should read
-- Bernede, J.C. Polarized memory switching in MIS thin films, Thin Solid Films 81 (1981) 155-160. --;

"Feng, X.; Bresser, W.J.; Zhang, M.; Goodman, B.; Boolchand, P., Role of network connectivity on the elastic, plastic and thermal behavior of covalent glasses, J. Non-Cryst. Solids 222 (1997) 134-143." should read
-- Feng, X.; Bresser, W.J.; Zhang, M.; Goodman, B.; Boolchand, P., Role of network connectivity on the elastic, plastic and thermal behavior of covalent glasses, J. Non-Cryst. Solids 222 (1997) 137-143. --;

"Messoussi, R.; Bernede, J.C.; Benhida, S.; Abachi, T.; Latef, A., Electrical characterization of M/Se structures (M=NI, BI), Mat. Chem, And Physics 28 (1991) 253-258." should read
-- Messoussi, R.; Bernede, J.C.; Benhida, S.; Abachi, T.; Latef, A., Electrical characterization of M/Se structures (M=Ni, Bi), Mat. Chem, And Physics 28 (1991) 253-258. --;

"Snell, A.J.; Hajto, J.; Rosa, M.J.; Osborne, L.S.; Holmes, A.; Owen, A.E.; Gibson, R.A.G., Analogue memory effects in metal/a -Si:H/metal thin films structures, Mat. Res. Soc. Symp. Proc. V 297, 1993, 1017-1021." should read
-- Snell, A.J.; Hajto, J.; Rose, M.J.; Osborne, L.S.; Holmes, A.; Owen, A.E.; Gibson, R.A.G., Analogue memory effects in metal/a -Si:H/metal thin films structures, Mat. Res. Soc. Symp. Proc. V 297, 1993, 1017-1021. --; and "Rose, M.J.; Snell, A.J.; Lecomber, P.G.; Hajto, J.; Fitzgerald, A.G.; Owen, A.E., Aspects of non-volatility in a –SI:H memory devices, Mat. Res. Soc. Symp. Proc. V 258, 1992, 1075-1080" should read
-- Rose, M.J.; Snell, A.J.; Lecomber, P.G.; Hajto, J.; Fitzgerald, A.G.; Owen, A.E., Aspects of non-volatility in metal/a –Si:H/metal memory devices, Mat. Res. Soc. Symp. Proc. V 258, 1992, 1075-1080. --.

UNITED STATES PATENT AND TRADEMARK OFFICE
CERTIFICATE OF CORRECTION

PATENT NO. : 6,953,720 B2
DATED : October 11, 2005
INVENTOR(S) : John T. Moore et al.

It is certified that error appears in the above-identified patent and that said Letters Patent is hereby corrected as shown below:

<u>Column 3,</u>
Line 56, "to second" should read -- to a second --; and

<u>Column 7,</u>
Line 63, "carried Out" should read -- carried out --.

Signed and Sealed this

Twenty-eighth Day of March, 2006

JON W. DUDAS
*Director of the United States Patent and Trademark Office*